(12) United States Patent
Grosh et al.

(10) Patent No.: US 8,531,088 B2
(45) Date of Patent: Sep. 10, 2013

(54) PIEZOELECTRIC MEMS MICROPHONE

(75) Inventors: Karl Grosh, Ann Arbor, MI (US); Robert J. Littrell, Ann Arbor, MI (US)

(73) Assignee: The Regents of The University of Michigan, Ann Arbor, MI (US)

(*) Notice: Subject to any disclaimer, the term of this patent is extended or adjusted under 35 U.S.C. 154(b) by 1107 days.

(21) Appl. No.: 12/495,195

(22) Filed: Jun. 30, 2009

(65) Prior Publication Data
US 2010/0254547 A1    Oct. 7, 2010

Related U.S. Application Data

(60) Provisional application No. 61/076,928, filed on Jun. 30, 2008.

(51) Int. Cl.
*H04R 3/00*    (2006.01)
(52) U.S. Cl.
USPC ............ 310/332; 310/367; 310/368; 381/114
(58) Field of Classification Search
USPC .................. 310/338, 367, 368, 332; 381/114
See application file for complete search history.

(56) References Cited

U.S. PATENT DOCUMENTS

| | | | |
|---|---|---|---|
| 6,700,309 B2 * | 3/2004 | Dausch et al. ................. | 310/330 |
| 6,857,501 B1 | 2/2005 | Han et al. | |
| 6,895,645 B2 * | 5/2005 | Xu et al. ....................... | 29/25.35 |
| 2004/0109938 A1 * | 6/2004 | Liu ..................................... | 427/8 |
| 2005/0200242 A1 | 9/2005 | Degertekin | |
| 2006/0131997 A1 * | 6/2006 | Kim et al. ...................... | 310/328 |
| 2007/0023851 A1 * | 2/2007 | Hartzell et al. ................ | 257/414 |
| 2007/0089516 A1 | 4/2007 | Khuri-Yakub et al. | |
| 2007/0145861 A1 * | 6/2007 | Tanner ........................... | 310/339 |
| 2007/0287233 A1 * | 12/2007 | Zhan et al. ..................... | 438/149 |

FOREIGN PATENT DOCUMENTS

| | | | |
|---|---|---|---|
| KR | 10-2002-0015384 | * | 9/2003 |
| KR | 10-2003-0075906 | | 9/2003 |
| KR | 10-2007-0098735 | | 10/2007 |

OTHER PUBLICATIONS

International Search Report for PCT/US2009/049248, Feb. 17, 2010, 4 pages.
Written Opinion for PCT/US2009/049248, Feb. 17, 2010, 4 pages.
Krommer, M., (2001). "On the correction of the Bernoulli-Euler beam theory for smart piezoelectric beams." Smart Materials and Structures, (10), 668-680.

(Continued)

*Primary Examiner* — Thomas Dougherty
*Assistant Examiner* — Bryan Gordon
(74) *Attorney, Agent, or Firm* — Reising Ethington P.C.

(57) ABSTRACT

A piezoelectric MEMS microphone comprising a multi-layer sensor that includes at least one piezoelectric layer between two electrode layers, with the sensor being dimensioned such that it provides a near maximized ratio of output energy to sensor area, as determined by an optimization parameter that accounts for input pressure, bandwidth, and characteristics of the piezoelectric and electrode materials. The sensor can be formed from single or stacked cantilevered beams separated from each other by a small gap, or can be a stress-relieved diaphragm that is formed by deposition onto a silicon substrate, with the diaphragm then being stress relieved by substantial detachment of the diaphragm from the substrate, and then followed by reattachment of the now stress relieved diaphragm.

6 Claims, 16 Drawing Sheets

(56) References Cited

OTHER PUBLICATIONS

Irschik, H., Krommer, M., Belyaev, A.K., Schlacher, K., (1998). "Shaping of Piezoelectric Sensors/Actuators for Vibrations of Slender Beams: Coupled Theory and Inappropriate Shape Functions." Journal of Intelligent Material Systems and Structures, (9), 546-554.

DeVoe, D.L., Pisano, A.P., (1997). "Modeling and Optimal Design of Piezoelectric Cantilever Microactuators." Journal of Microelectromechanical Systems, (6), 266-270.

Elka, E., Elata, D., Abramovich, H., (2004). "The Electromechanical Response of Multilayered Piezoelectric Structures." Journal of Microelectromechanical Systems, (13), 332-341.

Levinzon, F.A., (2004). "Fundamental Noise Limit of Piezoelectric Accelerometer." IEEE Sensors Journal, (4), 108-111.

Levinzon, F.A., (2000). "Noise of the JFET Amplifier." IEEE Transactions on Circuits and Systems-I: Fundamental Theory and Applications, (47), 981-985.

Ried, R.P., Kim, E.S., Hong, D.M., Muller, R.S., (1993). "Piezoelectric Microphone with On-Chip CMOS Circuits." Journal of Microelectromechanical Systems, (2), 111-120.

Niu, M.N., Kim, E.S., (2003). "Piezoelectric Bimorph Microphone Built on Micromachined Parylene Diaphragm." Journal of Microelectromechanical Systems, (12), 892-898.

Trolier-McKinstry, S., Muralt, P., (2004). "Thin Film Piezoelectrics for MEMS." Journal of Electroceramics, (12), 7-17.

Tsubouchi, K., Mikoshiba, N., (1985). "Zero-Temperature-Coefficient SAW Devices on AlN Epitaxial Thin Films." IEEE Transactions on Sonics and Ultrasonics, (SU-32), 634-644.

Dubois, M.A., Muralt, P., (1999). "Properties of aluminum nitride thin flims for piezoelectric transducers and microwave filter applications." Applied Physics Letters, (74), 3032-3034.

Hooker, M.W., (1998). "Properties of PZT-Based Piezoelectric Ceramics Between -150 and 250° C." NASA Report: NASA/CR-1998-208708.

Ledermann, N., Muralt, P., Baborowski, J., Forster, M., Pellaux, J.-P., "Piezoelectric Pb($Zr_x$, $Ti_{1-x}$)$O_3$ thin film cantilever and bridge acoustic sensors for miniaturized photoacoustic gas detectors." J. Micromech. Microeng. 14 (2004) 1650-1658.

Martin, F., Muralt, P., Dubois, M.A., Pezous, A., (2004). "Thickness dependence of the properties of highly c-axis textured AlN thin films." J. Vac. Sci. Technol. A, vol. 22, No. 2, 361-365.

\* cited by examiner

PIEZOELECTRIC MEMS MICROPHONE

CROSS-REFERENCE TO RELATED APPLICATION

This application claims the benefit of U.S. Provisional Application No. 61/076,928, filed Jun. 30, 2008, the entire contents of which are hereby incorporated by reference.

TECHNICAL FIELD

This invention relates generally to piezoelectric microphones and, in particular, to piezoelectric MEMS microphones and design techniques for constructing such microphones to meet the requirements of a particular end use application.

BACKGROUND OF THE INVENTION

The rise of microelectromechanical systems (MEMS) technology has enabled the development of acoustic transducers such as microphones using silicon-wafer deposition techniques. Microphones fabricated this way are commonly referred to as MEMS microphones and can be made in various forms such as capacitive microphones or piezoelectric microphones using a material such as PZT, ZnO, PVDF, PMN-PT, or AlN. MEMS capacitive microphones and electret condenser microphones (ECMs) are used in consumer electronics and have an advantage over typical piezoelectric MEMS microphones in that they have greater sensitivity and lower noise floors. However, each of these more ubiquitous technologies has its own disadvantages. For standard ECMs, they typically cannot be mounted to a printed circuit board using the typical lead-free solder processing commonly used on all other microchips attached to the board. MEMS capacitive microphones, which are often used in cell phones, are relatively expensive due at least in part to the use of an application-specific integrated circuit (ASIC) that provides readout circuitry for the microphone. MEMS capacitive microphones also have a smaller dynamic range than typical piezoelectric MEMS microphones.

The noise floors of various known piezoelectric and capacitive MEMS microphones are shown in FIG. 1. As indicated by the two encircled groups of microphones, capacitive MEMS microphones (the lower group) generally have a noise floor that is about 20 dB lower than similarly sized piezoelectric MEMS microphones.

Known piezoelectric MEMS microphones have been made either as cantilevered beams or as a diaphragm, and these microphones include both electrodes and the piezoelectric material along with a structural material such as Parylene or silicon that is used as a diaphragm or beam substrate material. An advantage of Parylene for cantilever designs is that it is can be used to increase the thickness of the beam which both increases the bandwidth of the beam (for a fixed length) and increases the distance from the neutral axis of the piezoelectric material, which seemingly increases sensitivity. For example, beam substrates of about 20 µm are known, see Ledermann [15]. For piezoelectric MEMS microphones that utilize a Parylene diaphragm, thinner layers have been used. See, for example, U.S. Pat. No. 6,857,501 and Niu [10]. Note that the various references made herein to other authors are references to literature and journal articles identified at the end of this description and are provided only for non-essential subject matter in support of or as background for some of the teachings herein. Each of the referenced works are hereby incorporated by reference.

SUMMARY OF THE INVENTION

In accordance with one aspect of the invention, there is provided a piezoelectric MEMS microphone, comprising a substrate and a multi-layer acoustic sensor having at least three layers that includes a first electrode layer, an intermediate layer of piezoelectric material deposited over the first electrode layer, and a second electrode layer deposited over the piezoelectric material. The sensor is dimensioned such that the ratio of output energy to sensor area for the multi-layer sensor is at least 10% of the maximum ratio obtainable for a given input pressure, bandwidth, and piezoelectric material.

In accordance with another aspect of the invention, there is provided a piezoelectric MEMS microphone, comprising a substrate and a multi-layer acoustic sensor having at least three layers that includes a first electrode layer, an intermediate layer of piezoelectric material deposited over the first electrode layer, and a second electrode layer deposited over the piezoelectric material. The sensor is dimensioned such that an optimization parameter calculated according to the equation $$\text{Optimization Parameter} = \frac{V_{out}^2 C}{P^2 A \tan(\delta)} \cdot f_{res}^2$$

is at least 10% of the maximum obtainable optimization parameter for the sensor, where $V_{out}$ is output voltage of the sensor, $C$ is the capacitance of the sensor, $P$ is the input pressure, $A$ is the sensor area, $\tan(\delta)$ is dielectric loss angle of the sensor at the sensor's first resonant frequency, and $f_{res}$ is the first resonant frequency.

In accordance with another aspect of the invention, there is provided a piezoelectric MEMS microphone, comprising a silicon substrate and a plurality of beams each supported at one end by the substrate such that each beam is cantilevered and extends between a fixed end and a free end. Each beam comprises a deposited layer of electrode material and a deposited layer of piezoelectric material overlying the electrode material. At least some of the beams are stacked such that the stacked beams include alternative layers of deposited electrode material and deposited piezoelectric material with no additional layers therebetween.

In accordance with yet another aspect of the invention, there is provided a piezoelectric MEMS microphone, comprising a substrate and a stress-relieved diaphragm suspended above the substrate. The diaphragm comprises a multi-layer acoustic sensor having at least three layers including a first electrode layer, an intermediate layer of piezoelectric material deposited over the first electrode layer, and a second electrode layer deposited over the piezoelectric material. The stress relieved diaphragm can be obtained in any suitable manner, such as for example, by detaching it from the substrate about substantially all of its periphery and allowing it to expand or contract as needed to relieve residual stress. The diaphragm can then be reattached to the substrate about its periphery by any suitable technique.

BRIEF DESCRIPTION OF THE DRAWINGS

One or more preferred exemplary embodiments of the invention will hereinafter be described in conjunction with the appended drawings, wherein like designations denote like elements, and wherein:

FIG. 3b depicts a cross-sectional view of two pairs of facing beams from the microphone sensor of FIG. 3a;

FIG. 6 depicts the impact of beam taper on the output energy of the sensor of FIG. 3a;

FIG. 10 is a microscope picture of a fabricated sensor of FIG. 3a;

FIG. 11 is a picture of a piezoelectric MEMS microphone using the sensor of FIG. 3a;

FIG. 15 is a plot of the normalized output energy as a function of electrode length for a cantilever beam of the type shown in FIG. 3a;

FIG. 27b is a partial cross-sectional view taken along the B-B line of FIG. 27a.

DETAILED DESCRIPTION OF THE PREFERRED EMBODIMENTS

Figure 1:
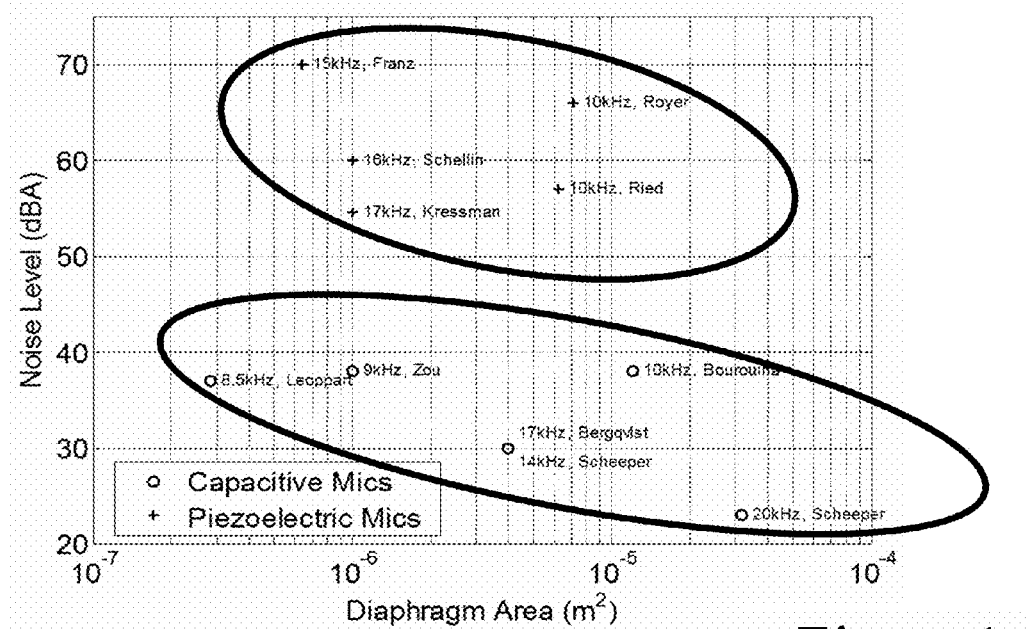
FIG. 1 is a plot of noise levels versus sensor area for various known MEMS microphones.

The description that follows is directed to various embodiments of a piezoelectric MEMS microphone that meets an optimization criteria which can be determined in one or more of the different manners described below.

Typical piezoelectric MEMS microphones are designed so as to optimize sensitivity of the microphone, and this is at least partially responsible for the increased noise floors noted above for these devices. As described below, by optimizing the ratio of output energy to sensor area for a given input pressure, bandwidth, and piezoelectric material, a piezoelectric MEMS microphone can be constructed that has sufficient sensitivity for typical applications along with a noise floor similar to that of capacitive MEMS microphones. This approach is valid for films of good quality. However, as the film is reduced in thickness, the film quality will degrade. This factor can be accounted for with an alternative approach described herein which utilizes a calculated optimization parameter that is still a ratio of sensor energy to area, but also includes the pressure, natural frequency (which limits the bandwidth), and the loss angle of the device. By adding these parameters into the calculated ratio, this alternative approach accounts for the effects of these parameters, rather than considering them as constants. Thus, as will be appreciated by those skilled in the art, the following embodiments are described in conjunction with two different usable approaches for determining an optimal or near-optimal sensor design—1) a straight calculation of output energy to sensor area ratio for a given (constant) input pressure, bandwidth and piezoelectric material and 2) a calculation of an optimization parameter that accounts for the pressure, natural frequency (which limits the bandwidth), and the loss angle of the device. This optimization parameter can be determined using the equation:

$$\text{Optimization Parameter} = \frac{V_{out}^2 C}{P^2 A \tan(\delta)} \cdot f_{res}^2$$

where $V_{out}$ is the output voltage, C is the device capacitance, P is the input pressure, A is the sensor area, $\tan(\delta)$ is the dielectric loss angle or dissipation factor of the microphone at the first resonant frequency, and $f_{res}$ is the first resonant frequency of the device. The use of this optimization parameter and the material characteristics and device geometry used in calculating this parameter will be described farther below. When the optimal film thicknesses are compared to the film properties plotted in FIGS. 18, 19, and 20 that are described further below, it is clear that most optimal film thicknesses have values such that they have nearly the properties of a thick film. For these films, optimization of the calculated energy to sensor area alone may be suitable without accounting for changes in electrode and/or piezoelectric properties. However, making the films substantially thinner than the optimal thicknesses can cause a large relative change in material properties, in which case use of the optimization parameter may be more suitable in determining sensor optimization.

Figure 2:
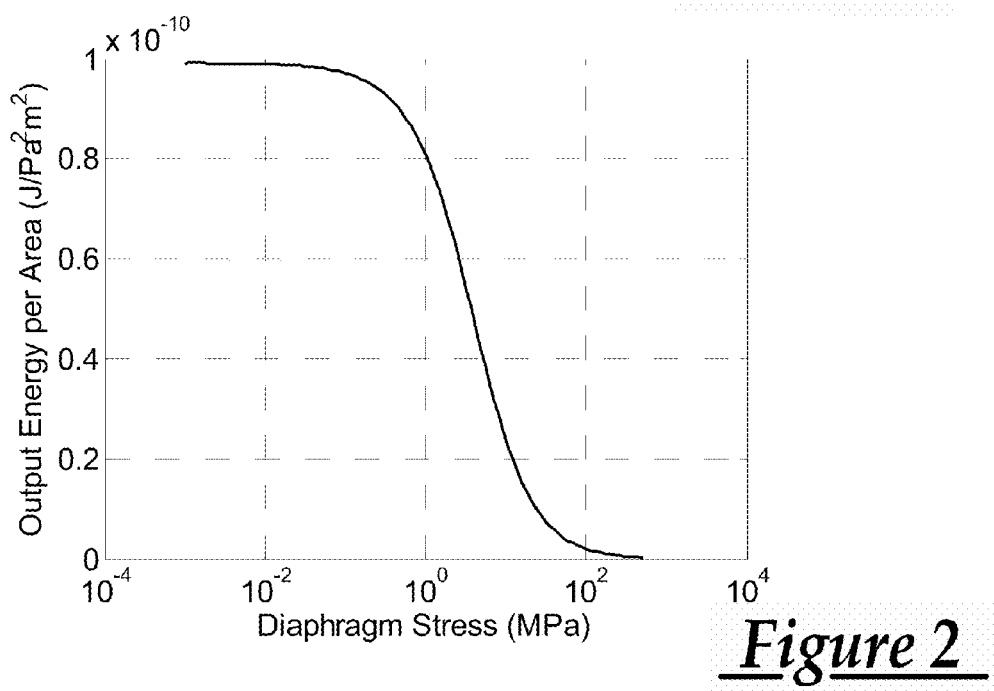
FIG. 2 is a plot depicting the influence of diaphragm residual stress on output energy of a piezoelectric MEMS microphone.

There are at least two aspects of more conventional piezoelectric MEMS microphone designs that have typically kept these prior designs from achieving this optimization. A first is the use of sensor structures, such as diaphragms, that have their stiffness dominated by tension. For piezoelectric MEMS microphone fabricated on a silicon wafer substrate, this tension is the result of residual stress left on each layer after deposition. This effect leads to a reduction in normalized output energy, one of the elements of the optimization parameter, as can be seen in FIG. 2. This figure shows how residual stress reduces the normalized output energy of a diaphragm with two 1 μm aluminum nitride (AlN) layers and three 100 nm molybdenum (Mo) layers with 20 kHz resonant frequency. Stresses as low as 1 MPa, a stress level difficult to achieve, reduces the normalized output energy of this diaphragm by 20%, reducing the optimization parameter by 20% as well. A second problem with prior designs that have kept them from approaching optimization of the relationship noted above is that these designs have not utilized optimal or near-optimal device geometries. Thus, for example, with cantilevered designs for which device residual stress is not a significant factor (due to the device being released from its substrate when forming the cantilever), the combination of layer thickness, layer order, beam shape, and even beam spacing to adjacent beams, make up the overall device geometry for which optimization is desired.

In accordance with the disclosed embodiments, these problems can be addressed in one or more ways. For cantilevers where device residual stress is not problematic, this can be done by utilizing a microphone design that achieves at least 10% of the maximum ratio obtainable of output energy to sensor area for a given input pressure, bandwidth, and piezoelectric material. As used herein, the "maximum ratio obtainable" for a given sensor design can be determined using an output energy calculation along with sensor area, or can be determined using the optimization parameter equation given above along with available (albeit sometimes varying) values and equations for the various parameters used in the optimization equation. In this latter approach, suitable sensor designs can be obtained for which the calculated optimization parameter is at least 10% of the maximum obtainable optimization parameter for the sensor. Other ways of determining the maximum ratio obtainable are possible, such as by repeated experimental determination or by using other optimization equations or techniques that are either now known or later developed. To achieve the desired level of 10% or more of the maximum optimization attainable, it has been determined through modeling and subsequent prototype testing that it is beneficial to make the sensor nearly as thin as possible and employing it in a topology in which multiple beams are either stacked to increase output or are built as individual beams with a thin (~1 μm) Parylene layer located centrally between the electrode and crystalline layers. In either approach, a plurality of beams can be produced that are then wired in a combination of series and parallel connections to obtain a desired combination of device capacitance and sensitivity for any given application. For diaphragms, an improved piezoelectric MEMS microphone can be built using a stress-relieved diaphragm, in which the piezoelectric sensor is made by deposition on a silicon-based substrate, then released from the substrate to permit expansion or contraction of the released membrane to relieve any residual stress, and then re-attached in any suitable manner. This technique could work for a diaphragm with any combination of clamped, pinned, or free perimeter conditions. Use of the optimization calculation above can also be used in making the diaphragm piezoelectric MEMS microphone to provide enhanced microphone sensitivity and noise performance. These cantilever and diaphragm designs provide useful operation of the device for many applications, and designs for which the calculated optimization parameter is above 10% of optimal can provide enhanced operation that provides good sensitivity with noise floors per unit area that are on par with or exceeding that of capacitive MEMS microphones.

The following embodiments provide exemplary designs using the above-described techniques, and the discussion that follows provides additional mathematical and fabrication details concerning how the various embodiments can be designed, implemented, and checked for optimization of the ratio noted above. Although optimization of the energy to sensor area ratio and, in particular, use of the optimization parameter is helpful in determining part or all of the sensor geometry, doing so is not necessary, as it is sufficient if the resulting microphone, however designed, meets the optimization criteria described herein.

Single and Stacked Beam Cantilevers

Figure 3A:
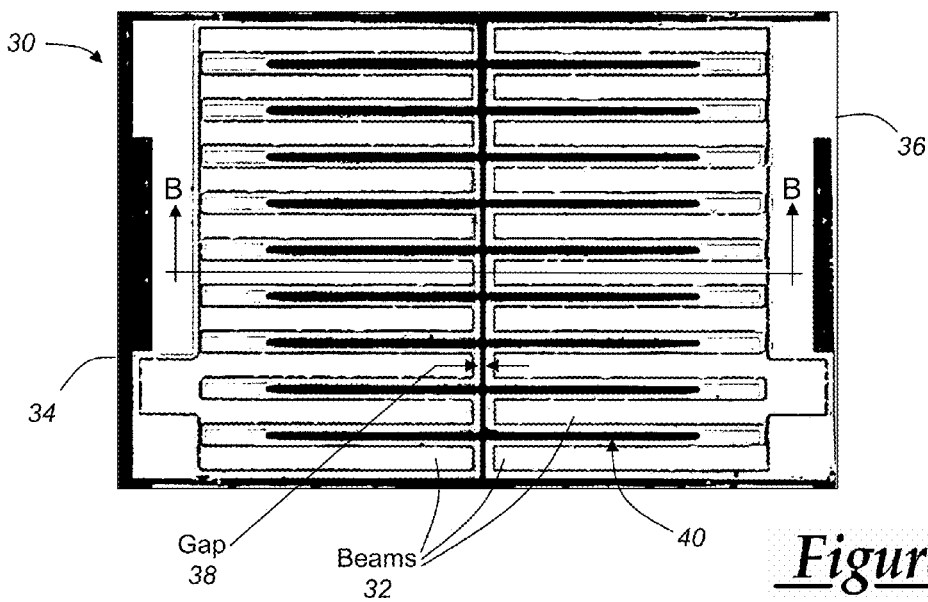
FIG. 3a is a top view of a beam cantilever piezoelectric MEMS microphone sensor constructed in accordance with one aspect of the invention.
Figure 3B:
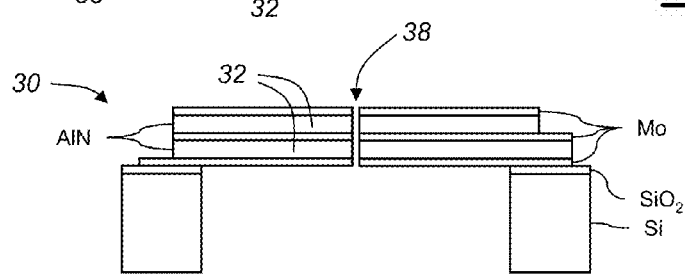

FIG. 3a depicts a beam cantilevered piezoelectric MEMS microphone 30 that comprises a multi-layer acoustic sensor having a plurality of fingered beams 32, each cantilevered at one of the two left and right sides 34, 36 of the microphone such the free ends of each facing pair of beams 32 are separated by a small gap 38 that can be formed using known MEMS manufacturing technology. Preferably, this gap is no greater than 3 μm, but can be larger depending on the design. For most applications, a gap of no greater than 10 μm can be used. A similar gap 40 can be used between adjacent (side-by-side) beams. Cantilevering of the beams 32 reduces the influence of material residual stress on the device bandwidth. Each beam 32 shown in FIG. 3a can be a single, isolated beam that is interconnected with the other beams to produce the overall microphone 30 having the desired capacitance and sensitivity characteristics. Alternatively, as shown in FIG. 3b, each beam 32 shown can be the upper beam of a stacked set of two or more beams formed by alternating layers of electrode and piezoelectric material. In FIG. 3b, there are five alternating layers, although it will be appreciated that, for a stacked beam configuration, additional layers could be used. These beams are constructed without any other layers or materials such that the beams comprise only electrode and piezoelectric layers. In the example shown, the electrode material is molybdenum and the piezoelectric material is aluminum nitride; however, it will be appreciated that any suitable conductive material can be used for the electrodes (e.g., titanium) and any suitable piezoelectric material can be used, such as PZT, ZnO, or others.

The beams 32 can have dimensions determined according to the design methodology described below to provide a desirable set of characteristics. For some embodiments, the piezoelectric layer can be under 1 μm, and more preferably, about 0.5 μm, although again this will vary based on a number of factors, including other beam dimensions, materials, etc. For most applications, the beam thickness, and thus the piezoelectric thickness, will be less than 2 μm, but can go as high as 8 μm depending upon the particular application involved. Preferably, the piezoelectric layer thickness is made as thin as possible while maintaining good piezoelectric film quality. For example, the layer can be made as thin as the available manufacturing technology makes possible as long as it has sufficient thickness to exhibit a sufficient piezoelectric effect for the particular application involved. The beam length should be related to the thickness, as indicated in the design description below. The electrode layer can vary as well, but preferably is on the order of 0.2 μm or less. Preferably, the base end of the beams are supported with a minimal amount of area to help minimize the resulting capacitance.

The MEMS microphone 30 has several advantageous features, any one or more of which can be achieved using the design methodologies described herein. These features include:

1. A maximized or near-maximized ratio of output energy to sensor area for a given bandwidth, pressure, and piezoelectric material.
2. The ability to design in a desired combination of sensor capacitance and sensitivity which is achieved by a combination of series and parallel connections between the individual beams. This can be done without impacting the overall output energy of the microphone and without impacting the input referred piezoelectric noise.
3. The use of adjacent beams separated by a small air gap that provides a high impedance to higher frequency sounds, thereby enabling the device to be designed with a lower frequency cutoff. As noted above, this can be done by keeping the space between adjacent beams (i.e., the gap between the facing ends of the beams and/or the gap between the adjacent sides of the beams) to within 10 μm and preferably within 3 μm. These gaps can be designed as discussed in Ledermann [15].
4. The use of stacked beams formed only of alternating layers of electrode and piezoelectric material.

Figure 3C:
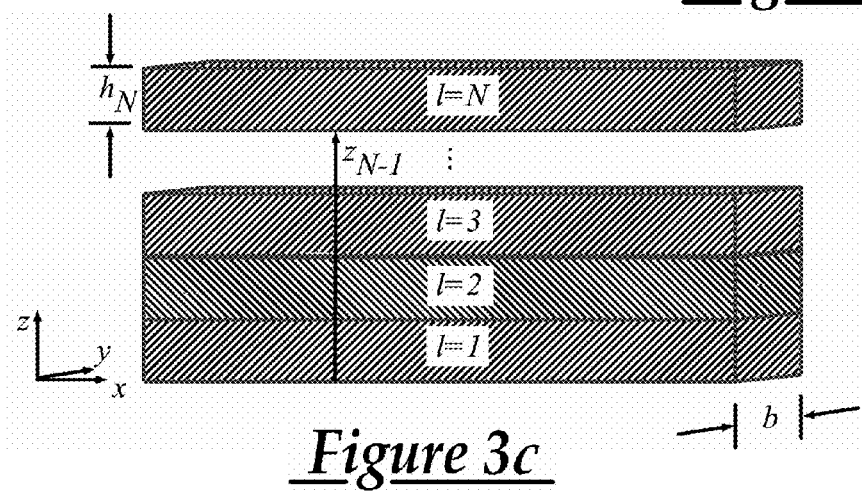
FIG. 3c shows alternating beam layers and their dimensions for use in modeling the behavior of the stacked beams shown in FIG. 3b.

The design of the cantilever microphone 30 for any particular application can be carried out using the design methodology described below. This methodology was developed based on mathematical modeling of the beams that was primarily done analytically and verified experimentally. The sensitivity of a single beam has been determined by starting with equation (20) of Krommer [1] and then determining the beam equation to be:

$$\rho A(x)\frac{\partial^2 w(x,t)}{\partial t^2} + \frac{\partial^2}{\partial x^2}\left(\sum_{l=1}^{N} M(x,t)\right) = f(x,t)$$

where $$\sum_{l=1}^{N} M(x,t) = \begin{aligned}&-\frac{b}{3}\frac{\partial^2 w}{\partial x^2}\sum_{l=1}^{N}\frac{1}{s_{11l}}\left(1+\frac{d_{31l}^2}{\varepsilon_{33l}s_{11l}-d_{31l}^2}\right)\\ &[(z_l-z_o)^3-(z_{l-1}-z_o)^3]+\\ &\frac{b}{2}\sum_{l=1}^{N}\frac{1}{s_{11l}}d_{31l}V_l\frac{(z_l-z_o)^2-(z_{l-1}-z_o)^2}{z_l-z_{l-1}}\end{aligned}$$

ρ is the density averaged through the thickness, A is the cross-sectional area, w is the beam deflection, t is time, x is the distance along the beam, M is the beam bending moment, f is the force per unit width, b is the beam width, N is the number of layers l, s is the elastic material compliance, d is a piezoelectric coupling coefficient, ∈ is the electric permittivity, z is the height from the bottom of the beam as seen in FIG. 3c, and V is the voltage across the layer. $z_0$ would be the neutral axis if the beam had no piezoelectric material and can be computed:

$$z_o = \frac{1}{2}\frac{\sum_{l=1}^{N}\frac{1}{s_{11l}}(z_l^2-z_{l-1}^2)}{\sum_{l=1}^{N}\frac{1}{s_{11l}}(z_l-z_{l-1})}.$$

The boundary conditions for the beam equation are:

$$w = 0 @ x = 0$$

$$\frac{\partial w}{\partial x} = 0 @ x = 0$$

$$\sum_{l=1}^{N} M(x,t) = 0 @ x = L, \text{ and}$$

$$\frac{\partial}{\partial x}\sum_{l=1}^{N} M(x,t) = 0 @ x = L.$$

The voltage, V, in the moment equation can be determined by extending the method of Irschik [2] to multiple layers resulting in:

$$V_l = -\frac{d_{31l}}{s_{11l}\varepsilon_{33l}-d_{31l}^2}\left[\frac{1}{2}[(z_l-z_o)^2-(z_{l-1}-z_o)^2]\frac{1}{L}\frac{\partial w(x=L)}{\partial x}+\frac{\sum_{l=1}^{N}\frac{1}{s_{11l}}d_{31l}V_l(z_l-z_{l-1})}{\sum_{l=1}^{N}\frac{1}{s_{11l}}(z_l-z_{l-1})}\right]$$

The capacitance of a layer is given by:

$$C_l = \frac{\varepsilon_{33l} bL}{z_l - z_{l-1}}.$$

The output energy of a layer is calculated by multiplying the square of the layer voltage by the layer capacitance:

OutputEnergy$_l = V_l^2 C_l$

The device output energy (referred to as the output energy) will be the sum of the output energy of each layer provided that the beams 32 are wired in any combination of series or parallel that preserves this product. In designing and constructing the microphone 30, the parameters of the beam layup (e.g., layer height and length) can be selected such that the ratio of this output energy to the sensor area is maximized for a given input pressure, bandwidth, and piezoelectric material. This ratio is:

$$\frac{OutputEnergy}{SensorArea}.$$

Here, sensor area refers to the total chip surface area comprising piezoelectric beams. Preferably, the microphone 30 is designed and constructed to achieve as close to the maximum achievable value as possible. However, owing to a variety of reasons (e.g., cost of construction), designs of even as low as 10% of the optimal energy to sensor area ratios may be acceptable for certain applications.

It is advantageous to maximize this ratio term for two reasons. First, the output energy remains constant when wiring the beams 32 in series or parallel (allowing the microphone to be matched to a specific circuit). This has been pointed out in the work of Ried [9]. Second, the input referred piezoelectric noise remains constant when wiring the beams in series or parallel. Because both of these characteristics remain constant, maximizing this ratio can be used as a way to optimize the design.

The foregoing equations can be used with beams of arbitrary width and solved numerically to determine the sensitivity of the beam. For wider beams (plates), a simple substitution has been suggested by DeVoe [3] to turn the uniaxial stress assumption used above to a plane stress assumption. This substitution is $$\frac{1}{s_{11}} = \frac{1}{s_{11}(1-v^2)}, \text{ and } d_{31} = d_{31}(1+v).$$

However, Elka [4] has shown that the initial uniaxial strain assumption gives better results when compared to a 3D analytical model or a 3D finite element model. If it is assumed that the beam is of constant width, the equations simplify significantly and can be solved analytically. The assumption of small piezoelectric coupling from Tiersten [5] results in further simplifications. These equations can be used to determine the voltage developed by a specific beam and extended to determine the voltage developed by several beams, therefore giving the sensitivity of the piezoelectric microphone. Because beam density has been included in these equations, they can also be used to estimate the bandwidth of the microphone. These equations assume voltage sensing will be used and that the output of the beams is going into a high impedance input. Similar equations could be derived if charge sensing is assumed. These equations are also laid out in the works of Krommer [1] and Irschik [2]. For those skilled in the art, these equations could be used in the same manner as those given above to determine an optimized device utilizing charge amplification electronics.

The noise floor (minimum detectable signal) of the piezoelectric microphone 30 is limited fundamentally by the dielectric loss angle of the material as described by Levinzon [6]. This piezoelectric noise is thermal noise caused by the resistance of the film expressed as:

$$\frac{\overline{v_n^2}}{\Delta f} = 4kT \frac{1}{\omega C \tan(\delta)},$$

where $v_n$ is the noise spectral density, $\Delta f$ is the bandwidth, k is Boltzmann's constant, T is the temperature, $\omega$ is the radian frequency, C is the sensor capacitance, and $\tan(\delta)$ is the tangent of the dielectric loss angle of the material. This determines the output voltage noise of a given beam 32 or combination of beams. Other noise sources such as mechanical thermal noise from the beams, radiation impedance of the beams, and 1/f noise do not dominate the noise of the microphone.

Figure 4:
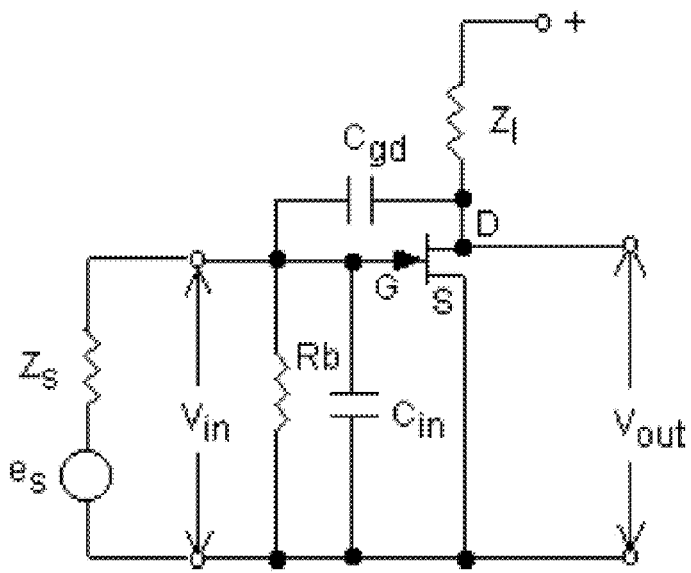
FIG. 4 depicts a schematic of the microphone of FIG. 3a connected to an amplifying circuit, showing impedance modeling for the circuit.
Figure 5:
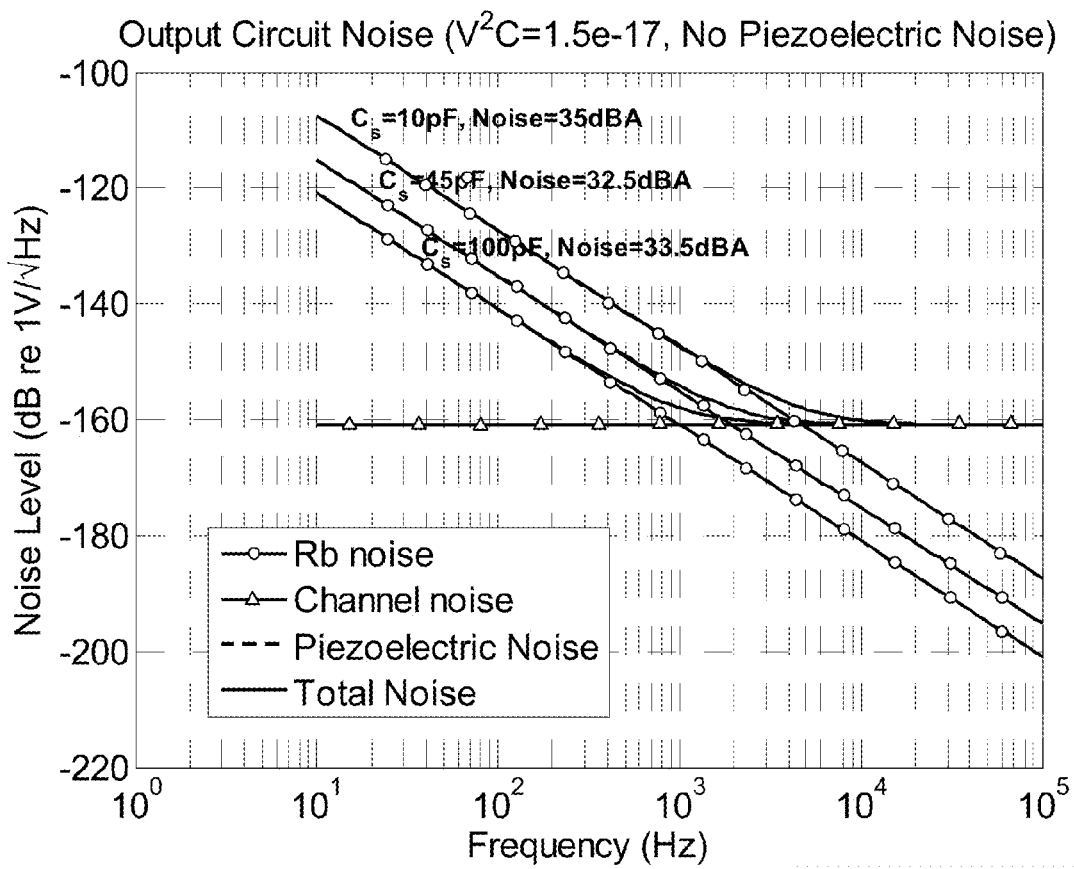
FIG. 5 is a plot of typical noise curves for a piezoelectric acoustic sensor.

Another significant source of noise is the noise of the accompanying electronics. The amplification electronics could be anything ranging from a charge amplifier to an integrated circuit for voltage amplification. The demonstrated device uses a junction field effect transistor (JFET) in a common source amplifier with a load resistor of 2.2 kΩ for amplification because these transistors have relatively low noise, are small, inexpensive, and relatively simple to model. The JFET noise can be modeled as shown by Levinzon [7]. At low frequencies, the thermal noise of the resistor $R_b$, shown in FIG. 4, dominates the circuit. A pole is formed at the frequency $\omega = 1/(R_b \| R_p \cdot C)$ where $R_p$ is the resistance of the piezoelectric layer obtained from $\tan(\delta)$. When $R_b$ dominates the resistance, a larger capacitance, C, moves the pole to a lower frequency and therefore further attenuates the thermal noise. A typical noise curve for a piezoelectric sensor connected to a JFET is shown in FIG. 5.

The dynamic range of the microphone 30 exceeds the requirements for most applications and will typically be limited by the electronics to which it is connected. The microphone 30 itself consumes no power so the total power consumption is dependent on that of the amplification circuitry. The area of the microphone is determined by the size and number of beams used and can be traded off with noise floor, sensitivity, and bandwidth.

The sensitivity of this microphone 30 to other parameters such as vibration and temperature has also been investigated. The sensitivity to vibration is related to the material density and thickness as given by:

$$\frac{acceleration}{pressure} = \frac{1}{\sum_{l=1}^{N} \rho_l h_l}.$$

These models were put into Matlab™ and an optimization was performed. The optimization was intended to give a bandwidth in the audible range, a low noise floor, and an area similar to that of commercial MEMS microphones.

Because this device 30 uses multiple beams 32, they can be connected in either series or parallel but the output energy, the product $V^2C$, remains constant for a given acoustic pressure as noted by Ried [9]. The method by which these beams are connected illustrates the trade-off between sensitivity and noise. If they are all connected in series, this maximizes sensitivity but the sensor capacitance, C, will be very small. If a JFET is used for amplification, this will increase the frequency of the pole filtering the noise and the resulting noise will increase. In general, a small capacitance will be detrimental because the input capacitance to the electronics will act as a capacitive divider and reduce the signal. If all the beams are connected in parallel, this results in the minimum sensitivity but maximum sensor capacitance. An optimal capacitance, usually between the two limiting cases discussed above (all parallel v. all series), can be identified to minimize the input referred noise of the system when using a JFET.

Thus, as will be appreciated by those skilled in the art, area can be traded off with sensitivity and noise floor. More beams consume more area but result in a larger $V^2C$ product. Bandwidth can also be traded off with noise floor, sensitivity, and area. Longer beams consume more area but give a larger $V^2C$ product for a given area because they are more compliant. These longer beams have a lower natural frequency and, therefore, a lower bandwidth.

Figure 6:
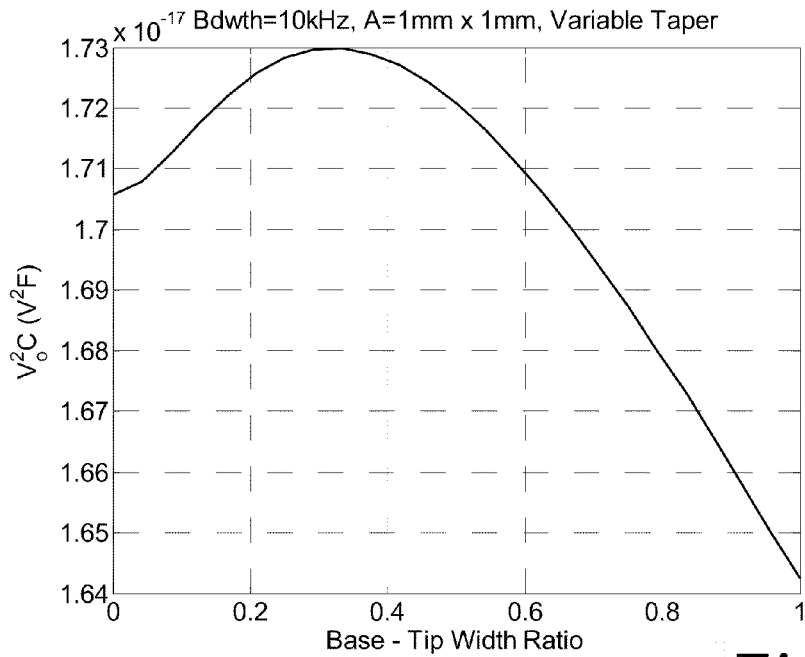
Figure 7:
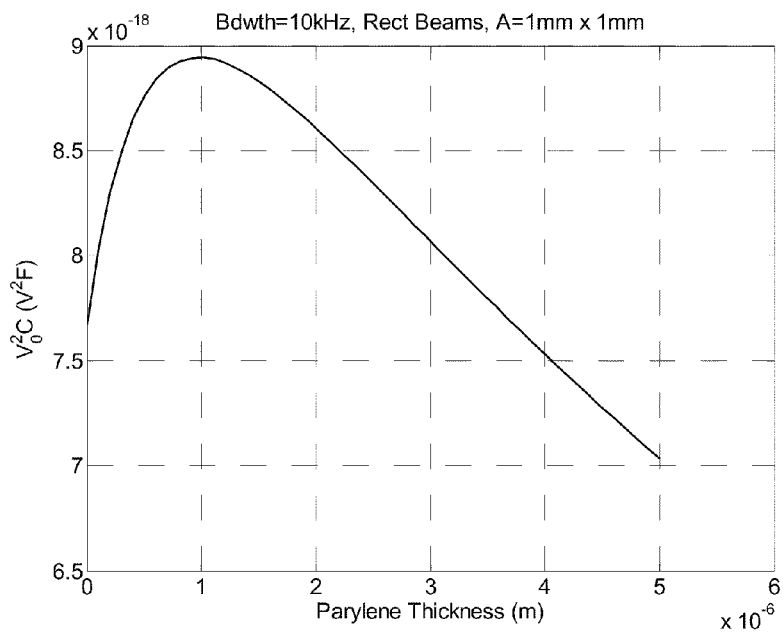
FIG. 7 depicts the impact of including one or more Paralyene layers showing the impact of layer thickness on the output energy of a piezoelectric MEMS microphone sensor.

There are other design/construction factors that influence microphone output. As shown in FIG. 6, beams having a width that is tapered toward their free ends can provide a greater $V^2C$ output energy. The peak value of this is at a beam base to tip ratio of about 0.33. Also, for at least single (non-stacked) beams, a layer of Parylene interposed between the electrode and piezoelectric can provide a better $V^2C$ output. In particular, after modeling the beam, FIG. 7 was generated to determine the advantage/disadvantage of an intermediate layer of Parylene. This figure shows that a thin layer of Parylene does slightly enhance the $V^2C$ product of a constant area/constant bandwidth group of beams. This thin layer was not used in the test devices because the Parylene may have higher surface roughness leading to a reduction in film quality of the top AlN layer. Because the top layer of AlN would likely be useless, the Parylene would need to double the $V^2C$ product to be beneficial ... which it does not. Thus, it may be desirable to limit the use of Parylene to microphone structures using on single (non-stacked) beams. Suitable materials other than Parylene that have a low modulus of elasticity and low density can be used as well.

After modeling and optimizing the device in Matlab™, devices were fabricated. Rectangular beams (as opposed to tapered beams) were built for the purpose of simpler fabrication and testing. The beams were built with a 200 nm Mo, 500 nm AlN, 200 nm Mo, 500 nm AlN, 200 nm Mo material stack because this combination gives relatively high sensitivity and low noise.

Figure 8:
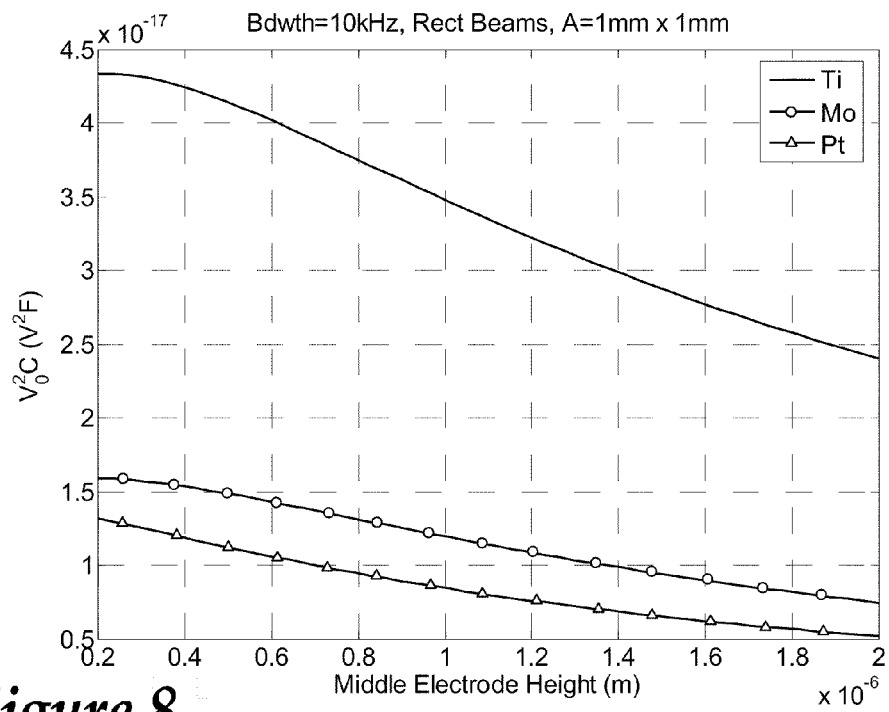
FIG. 8 is a plot showing how different electrode materials affect the energy output of a piezoelectric MEMS microphone sensor.

AlN was selected as the piezoelectric material because it gives equal or superior performance compared to other common MEMS piezoelectric materials such as ZnO and PZT but is more CMOS compatible than either of those two materials. It can be difficult to identify the optimal piezoelectric material because device performance will depend upon several material parameters such as $d_{31}$, $\tan(\delta)$, electric permittivity, s, and ρ. These properties depend upon material composition, deposition power/pressure/temperature, substrate roughness and crystal structure, material thickness, etc. In addition to material deposition variability, it can be difficult to find a source that provides all the necessary information for a complete material comparison as the quoted values for these parameters can vary substantially, more so for PZT than AlN because PZT has more variation in composition and orientation. Using the best values from the literature [11]-[14] to evaluate both AlN and PZT, they seem to have approximately equal potential for a successful device, although PZT does typically result in a higher sensitivity which could be possibly beneficial depending upon the microphone application. AlN parameters in the literature seemed to be more consistent and AlN and Mo are also already used in commercial FBAR processes so fabrications with these materials can more easily be transitioned to a commercial device. Mo was selected because high quality AlN has been deposited on Mo and because it worked with the rest of the processing steps. FIG. 8 shows how different electrode materials affect the $V^2C$ product. The best materials for this application are those with a low density and low stiffness. Titanium (Ti), therefore works better than Mo but was not used because of compatibility issues with other processing steps. The thicknesses of the layers were selected because these were the thinnest that could be reasonably deposited with good quality. The models indicate that thinner layers would be beneficial but were not attempted in the fabrication.

Figure 10:
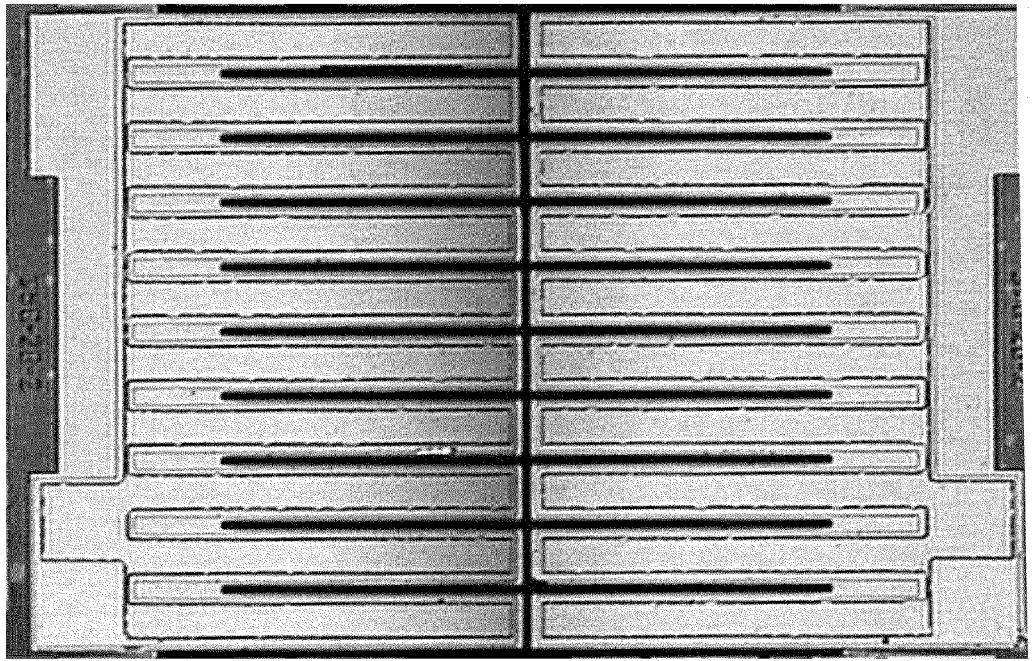
Figure 9A:
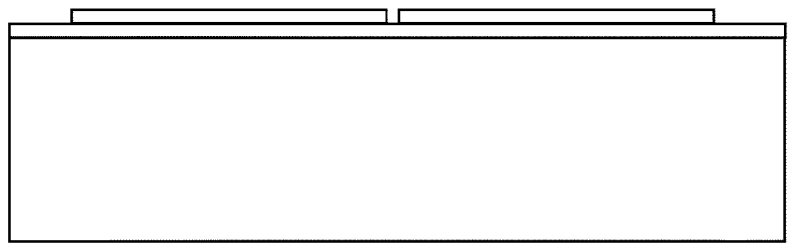
FIGS. 9a-9d depict the processing steps used to make the sensor of FIG. 3b.
Figure 9B:
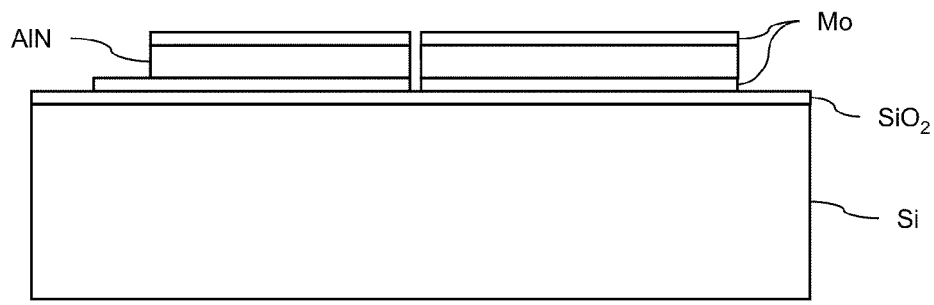
Figure 9C:
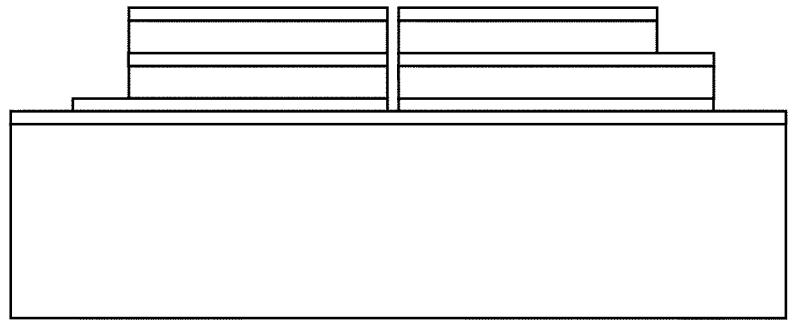
Figure 9D:
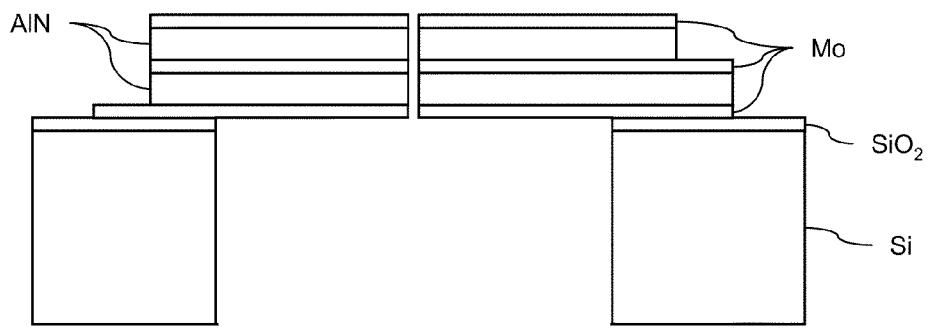

The processing of the device is shown in FIGS. 9a-9d. First, a 200 nm layer of $SiO_2$ was deposited as an etch stop for the DRIE etch. Then a 200 nm layer of Mo was deposited, patterned, and etched with dilute Aqua Regia ($9H_2O$:$1HNO_3$:3HCL). Next, a 500 nm layer of AlN followed by a 200 nm layer of Mo was deposited, patterned, and etched with dilute Aqua Regia for the Mo and hot (85 C)$H_3PO_4$ for the AlN. Then another 500 nm AlN and 200 nm Mo were deposited, patterned, and etched. All AlN depositions were performed at UC Berkeley by Harmonic Devices. During AlN deposition, residual stress was monitored in an attempt to limit beam curvature. Following these etches, both sides of the wafer were covered with 6 μm of $SiO_2$ and the back side was patterned and etched for the DRIE etch to release the beams. Next, the wafer was etched from the back side in an STS DRIE tool. The individual die were then diced with a dicing saw and the $SiO_2$ was removed in 5:1 BHF. Several steps could be improved upon, most notably, the length of the beams could be more well controlled if an anisotropic silicon etch were used to etch the back cavity and an etch stop was implanted into the silicon under the beams. Some designs utilized an additional metallization step before DRIE to connect the beams in different combinations of series or parallel and reduce stray capacitance but these devices were not used in this initial proof of concept. A microscope picture of the device can be seen in FIG. 10.

Figure 11:
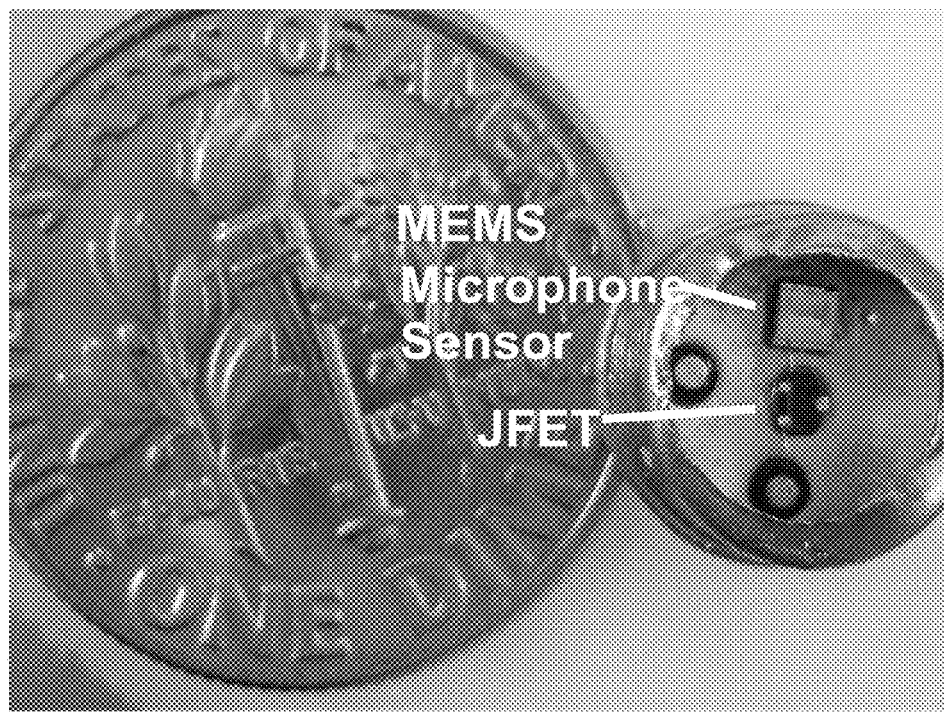
Figure 12:
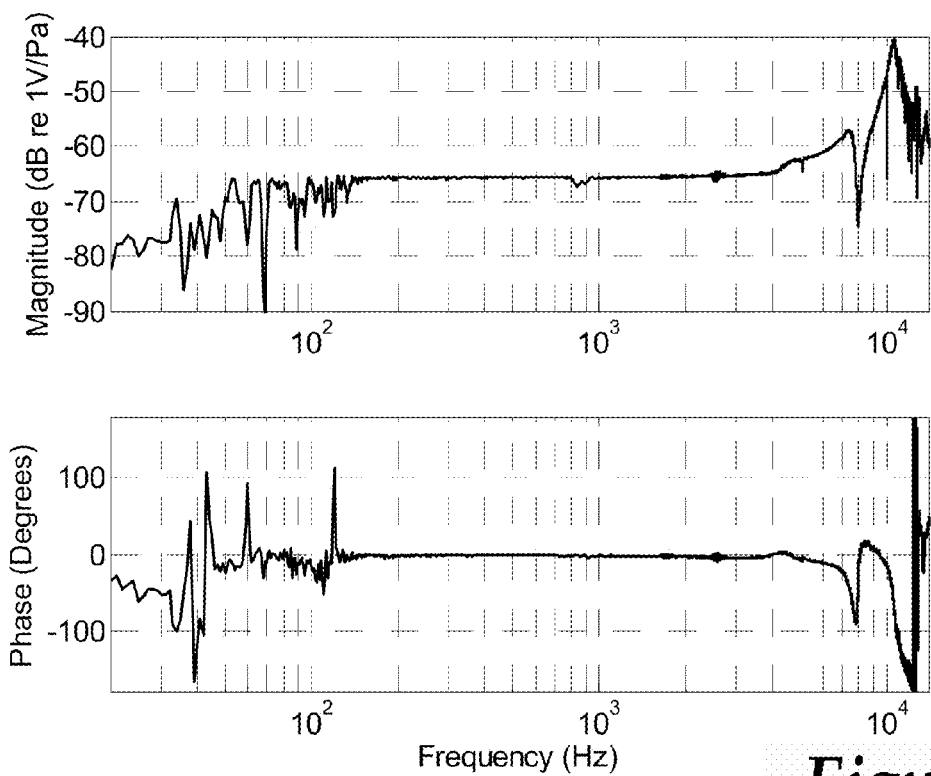
FIG. 12 shows plots of the frequency response of the microphone of FIG. 11.
Figure 13:
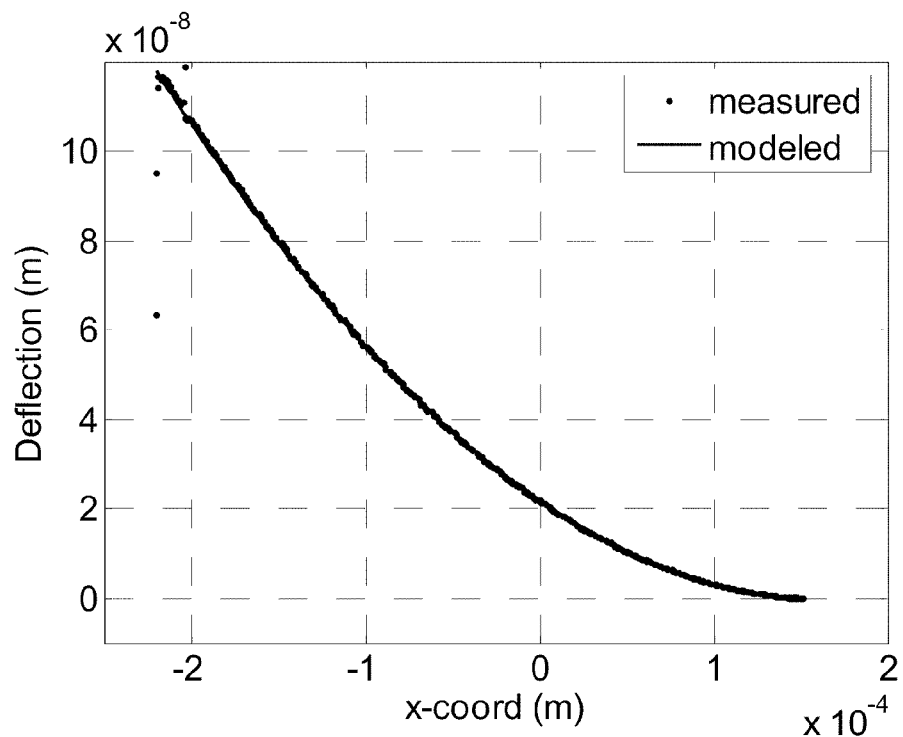
FIG. 13 is a plot of the beam deflection profile of the microphone of FIG. 11.

After fabricating the devices, they were packaged in a transistor outline (TO) can as seen in FIG. 11 and wire bonded to a JFET to buffer the signal. This can be done as indicated in FIG. 4 with the gate input of the JFET being connected to the sensor electrodes such that signals received from the electrodes are amplified by the transistor. A hole was drilled in the TO can below the microphone in order to give optical access to the beams and measure their deflection. This hole also allows the size of the back cavity to be adjusted, as the size of the back cavity will determine the low end of the microphone bandwidth. The microphone was then placed in a plane wave tube next to a reference microphone (Larsen Davis model 2520) and the frequency response was measured using a LabView A/D card and software. This can be seen in FIG. 12. The $d_{31}$ coefficient was measured by actuating the beams and measuring the beam curvature with a laser vibrometer. The beam deflection profile can be seen in FIG. 13.

The natural frequency of the beams was determined by measuring the frequency response of the beams to actuation. Another parameter that influences the microphone performance is the dielectric loss angle $\tan(\delta)$ of the microphone.

This has been measured with both custom circuitry in conjunction with LabView™ software and with an Agilent Model 4284A Precision LCR meter.

For this initial test, only the top layer of AlN was connected to the JFET and only on one side of the beams, thereby resulting in a noise floor 3 dB higher than would be expected if the entire microphone were connected to the JFET. The beams were drawn to be 356 μm but the DRIE etched further than expected, resulting in a natural frequency of approximately 11 kHz. This would suggest the beam length is actually approximately 400 μm. The $d_{31}$ coefficient was measured as $1.68 \times 10^{-12}$ N/C. This value is about 65% of the best values quoted in the literature. The $d_{31}$ coefficient has been shown to correlate with the X-ray diffraction rocking curve FWHM which, for this layer, is about 2.6 degrees while the best reported are around 1 degree. This value is likely higher than others because the layer is only 0.5 μm thick and on top of other layers. Tan(δ) was measured as 0.04 at 1 kHz. The literature typically gives tan(δ) in the range of 0.001 to 0.002 so this value is more than an order of magnitude higher than those typically quoted. It was determined that this higher than expected tan(δ) is due to some residual material left after etching the AlN with $H_3PO_4$. After some investigation, it was found that the tan(δ) can be reduced by cleaning with Acetone while in an ultrasound bath and heating on a hot plate. The devices with a lower tan(δ) will result in microphones with a lower noise floor.

Figure 14:
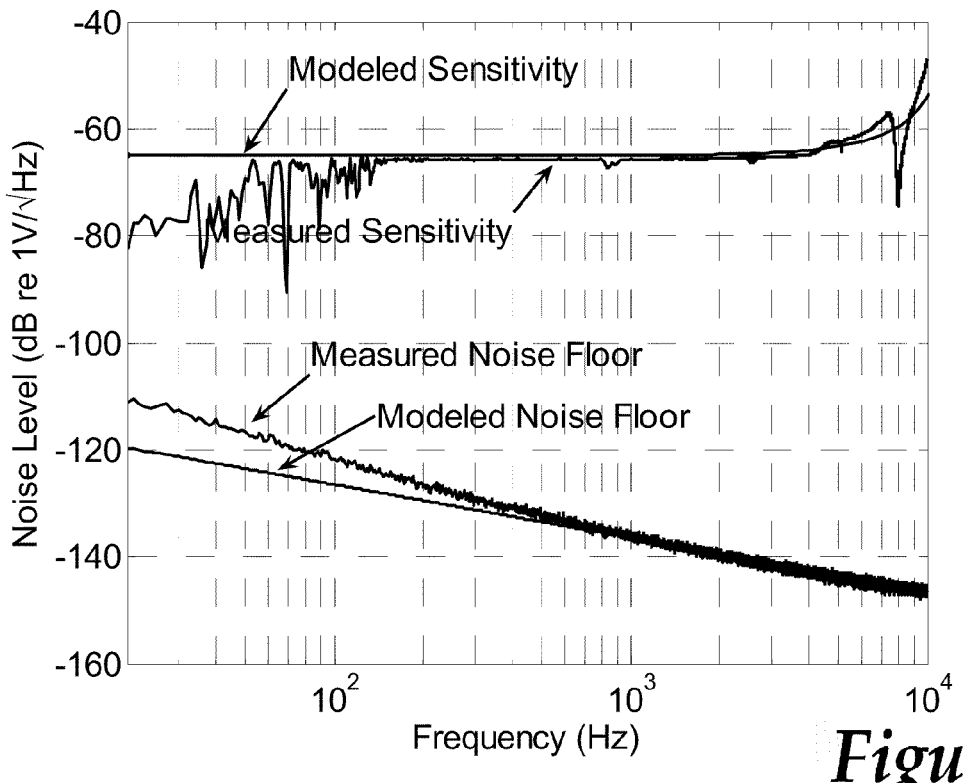
FIG. 14 is a plot of the measured and predicted sensitivities and noise floors for the microphone of FIG. 11.

With the measured $d_{31}$ coefficient and tan(δ) and using the length derived from the natural frequency measurement, the microphone model matches the measured performance quite well. The sensitivity, shown in FIG. 14, is measured as 0.52 mV/Pa out of the JFET common source amplifier with a 2.2 kOhm load resistor. This equates to a raw output sensitivity of 0.17 mV/Pa for the piezoelectric microphone. The model predicts an output sensitivity of 0.18 mV/Pa. The measured input referred noise floor for the device is 58.2 dBA while the model predicts an input referred noise floor of 57.3 dBA. FIG. 14 shows the measured and predicted sensitivities and noise floors. The first peak in the measured frequency response is caused by the natural frequency of the beams across from those used in the measurement. They are not exactly the same length due to a non-uniformity in the DRIE etch.

In the cantilevered beam designs described above, optimization of the output energy to sensor area ratio was determined based on a given input pressure, bandwidth, and piezoelectric material. However, these constraints can be taken into account in the design or analysis of a piezoelectric MEMS microphone. In particular, using the optimization parameter equation:

$$\text{Optimization Parameter} = \frac{V_{out}^2 C}{P^2 A \tan(\delta)} \cdot f_{res}^2$$

the input pressure can be accounted for by the pressure P term, the bandwidth by the $f_{res}$ term, and the characteristics of the piezoelectric material and the electrode by the dielectric loss angle tan(δ). Thus, where a given set of these input constraints is not used, the output energy to sensor area ratio can be optimized by maximizing the optimization parameter equation given above to take those other factors into account.

Figure 15:
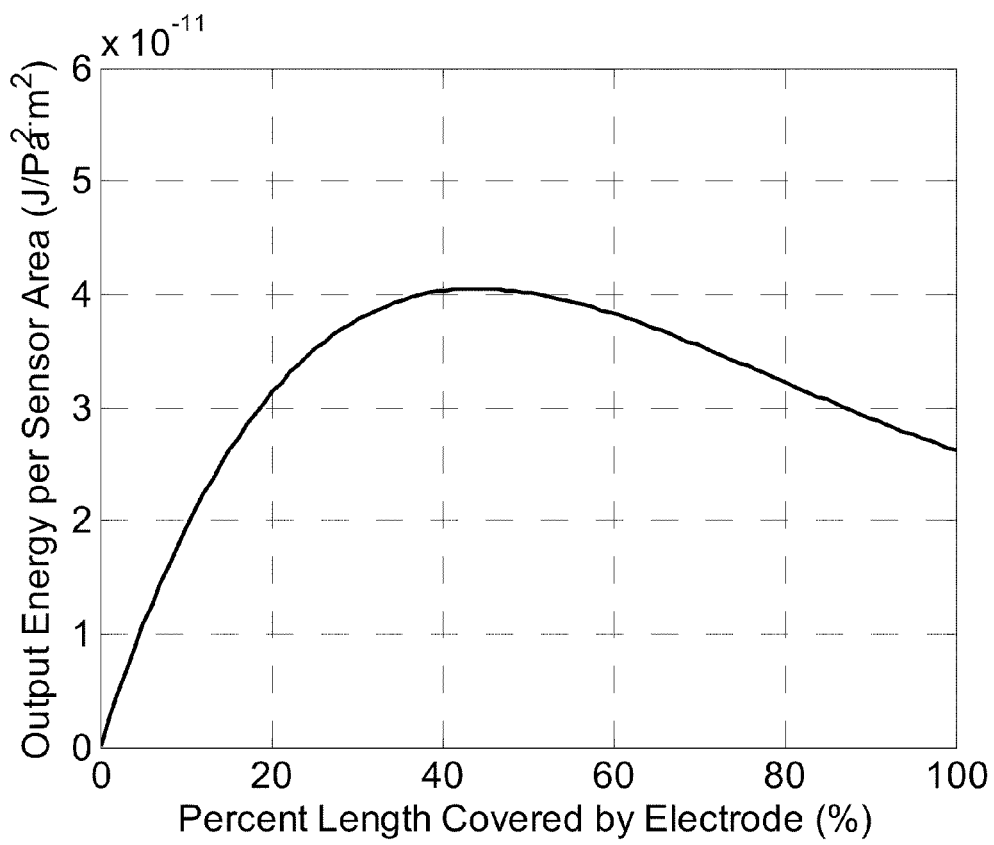

As one example, consider again a piezoelectric MEMS microphone that utilizes a rectangular cantilevered beam having one AlN piezoelectric layer and two Mo electrode layers. For a cantilever, the normalized output energy can be plotted as a function of electrode length as shown in FIG. 15. As the normalized output energy per unit area increases, so will the optimization parameter so the electrode will go from the base of the beam to roughly 50% the length of the beam.

When using aluminum nitride as a piezoelectric material, small piezoelectric coupling can be assumed. This assumption simplifies the expression for output voltage from that given above for $V_1$ to $$V_{out} = -\frac{PbL^2 d_{31} Z_Q}{12 E I \eta s_{11}}$$

where P is the pressure amplitude, b is the cantilever width, L is the cantilever length, $d_{31}$ is the 31 term of the piezoelectric coupling coefficient matrix, η is the electric permittivity of the piezoelectric material, $s_{11}$ is the 11 term of the compliance matrix, $Z_Q = (Z_k - zn)^2 - (Z_{k-1} - zn)^2$, where zn is the beam neutral axis, the subscript k refers to the layer and, in this case, refers to the piezoelectric layer, and EI is the beam bending rigidity given as $$EI = \frac{b}{3} \sum_{k=1}^{N} \frac{1}{s_k} Z_{Ck}$$

where $Z_{Ck} = (Z_k - zn)^3 - (Z_{k-1} - zn)^3$ and zn is given as $$zn = \frac{1}{2} \frac{\sum_{k=1}^{N} \frac{1}{s_k}(z_k^2 - z_{k-1}^2)}{\sum_{k=1}^{N} \frac{h_k}{s_k}}.$$

The capacitance is approximately $$C = \frac{\eta A_e}{h_p}$$

where $A_e$ is the area covered by the electrode and $h_p$ is the height of the piezoelectric layer. The first resonant frequency is approximately $$f_{res} = \frac{1.875^2}{2\pi L^2} \sqrt{\frac{EI}{b \sum_{k=1}^{N} \rho_k h_k}}.$$

The dielectric loss angle of the microphone is a function of the losses in the piezoelectric material itself as well as the losses in the electrodes. This can be approximated as $$\tan(\delta)_{mic} = \tan(\delta)_p + \frac{2\eta_p \omega L^2}{3\sigma_e h_e h_p}$$

where the subscripts, p and e, refer to the piezoelectric material and electrode material respectively, σ is the material conductivity, ω is the radian frequency, and L is the length of the electrode.

By combining these equations, assuming the length of the electrode is equal to the length of the cantilever beam, the optimization parameter can be calculated as $$OptimizationParameter = \frac{bd_{31p}^2 Z_{Q_p}^2 \sigma_e h_e h_p}{3EIh_p^2 \eta_p s_{11p}^2 \sigma_e h_e \tan(\delta)_p \sum_{i=1}^{N} \rho_i h_i + 2 \cdot 1.875^2 \eta_p \sqrt{\frac{EI}{b \sum_{i=1}^{N} \rho_i h_i}}}$$

Using this equation and thickness independent material properties, the optimization would lead to zero thickness layers and an infinite optimization parameter. As the molybdenum layer gets thin, however, its conductivity decreases. Also, very thin AlN tends to have a reduced piezoelectric coupling coefficient and a large loss angle. For this reason, these relationships must be included in the optimization.

Figure 16:
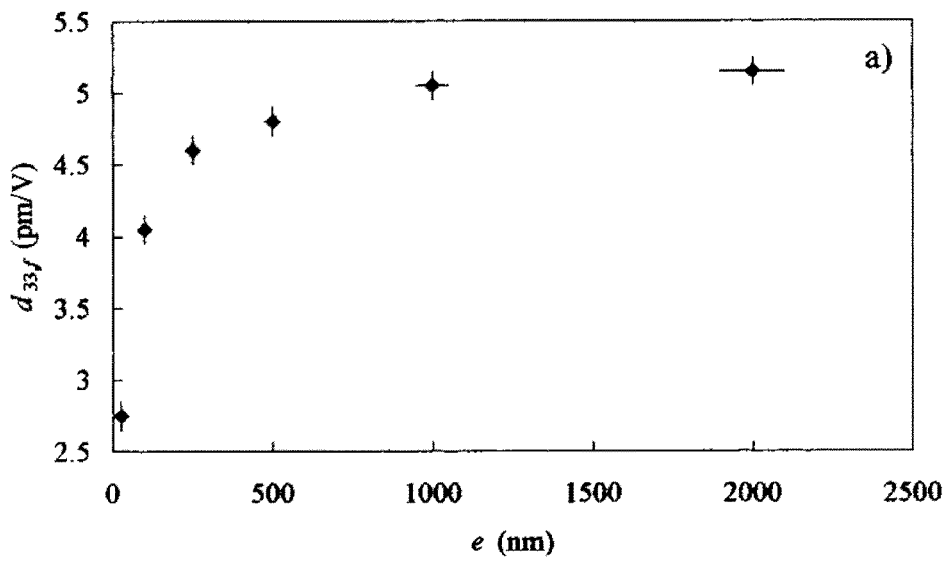
FIG. 16 is a plot showing the degradation of the $d_{33}$ coefficient from the piezoelectric coupling coefficient matrix for the AlN piezoelectric material.
Figure 17:
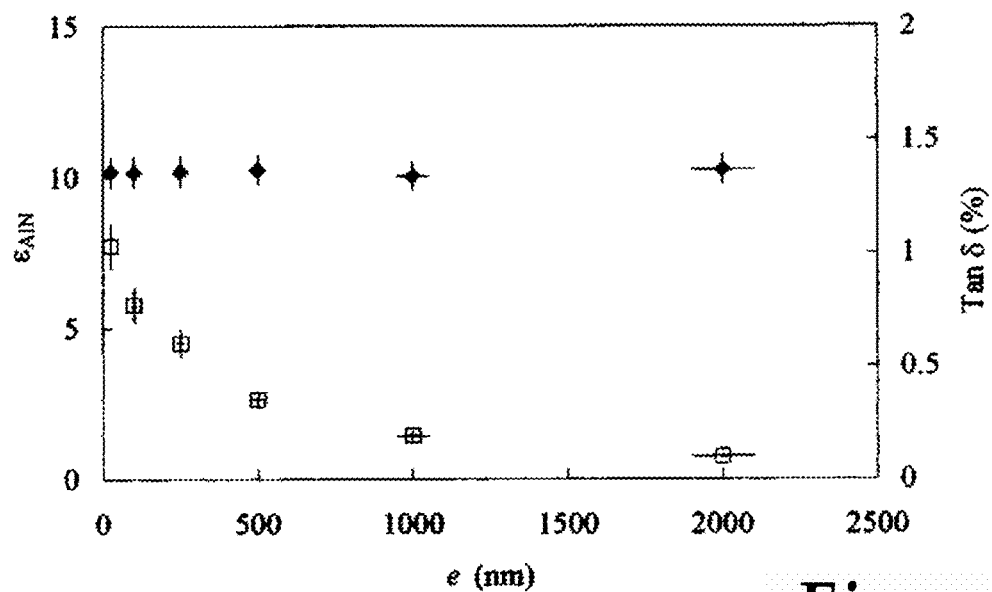
FIG. 17 is a plot showing the degradation of the dielectric loss angle $\tan(\delta)$.

The $d_{31}$ data can be extracted by assuming that the $d_{31}$ coefficient degrades at the same rate as the $d_{33}$ coefficient. Plots of $d_{33}$ and $\tan(\delta)$ degradation are given in Martin [16] and are shown in FIGS. 16 and 17, respectively. Alternatively, the dependence of $d_{31}$ on thickness could be determined experimentally.

The Mo conductivity will also change as the thickness is decreased. The dependence of Mo thickness with resistivity can be obtained using the model of Namba [17] to determine this relationship for modeling purposes. Using this model, a mean free path of 140 nm, P=Q=0, and an RMS surface roughness of 0.5 nm, the relationship between Mo thickness and resistivity can be determined. The assumed relationships between Mo resistivity and Mo thickness, between $d_{31}$ and AlN thickness, and between loss angle and AlN thickness are shown in respective FIGS. 18-20. Using the optimization parameter equation and the data from the plots above, the ideal thicknesses for a three layer device are shown in Table 1 below.

TABLE 1

| Layer | Thickness |
|---|---|
| Molybdenum #1 | 9 nm |
| Aluminum Nitride | 1.5 μm |
| Molybdenum #2 | 1.1 μm |

Figure 18:
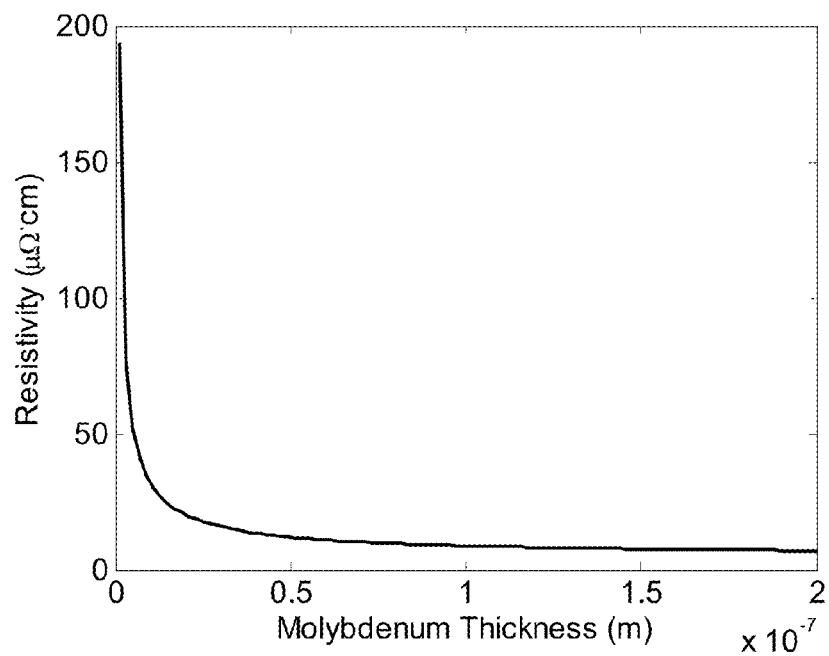
FIG. 18 is a plot showing Mo resistivity as a function of the electrode layer thickness.
Figure 19:
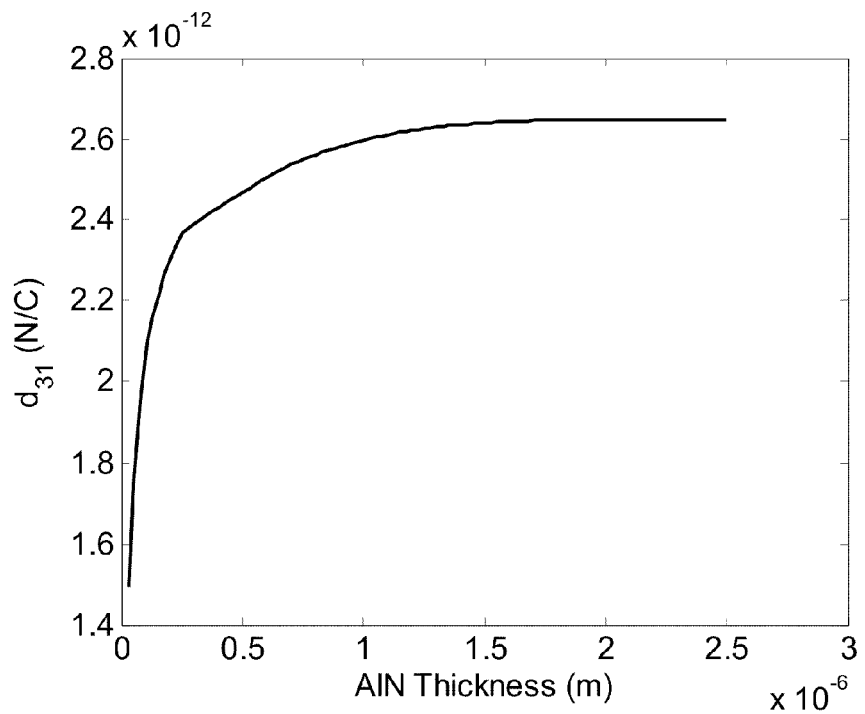
FIG. 19 is a plot of the relationship between piezoelectric layer thickness and the $d_{31}$ coefficient from the piezoelectric coupling coefficient matrix for the AlN piezoelectric material.
Figure 20:
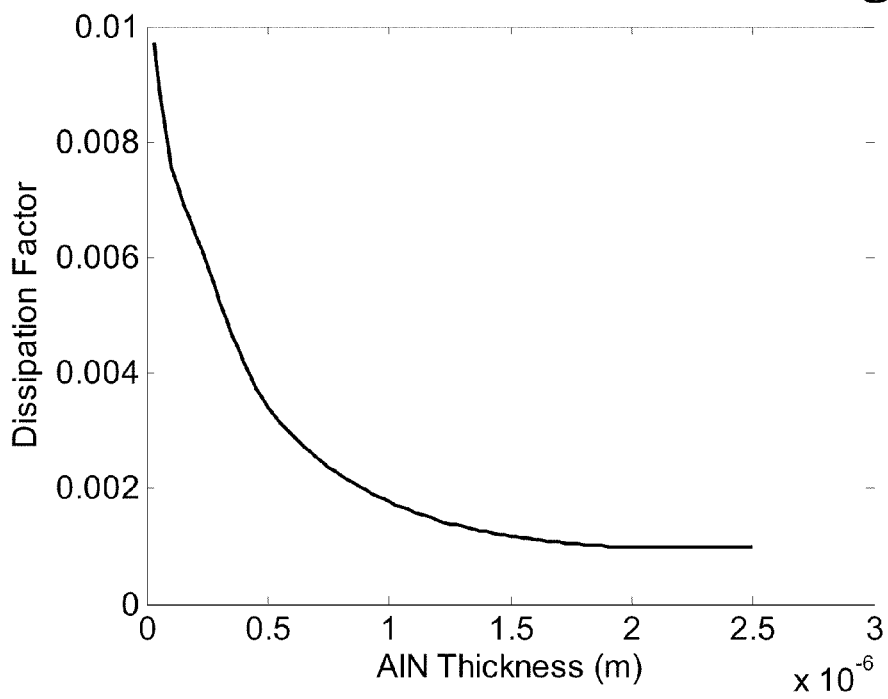
FIG. 20 is a plot showing the dielectric loss angle as a function of AlN layer thickness.
Figure 21:
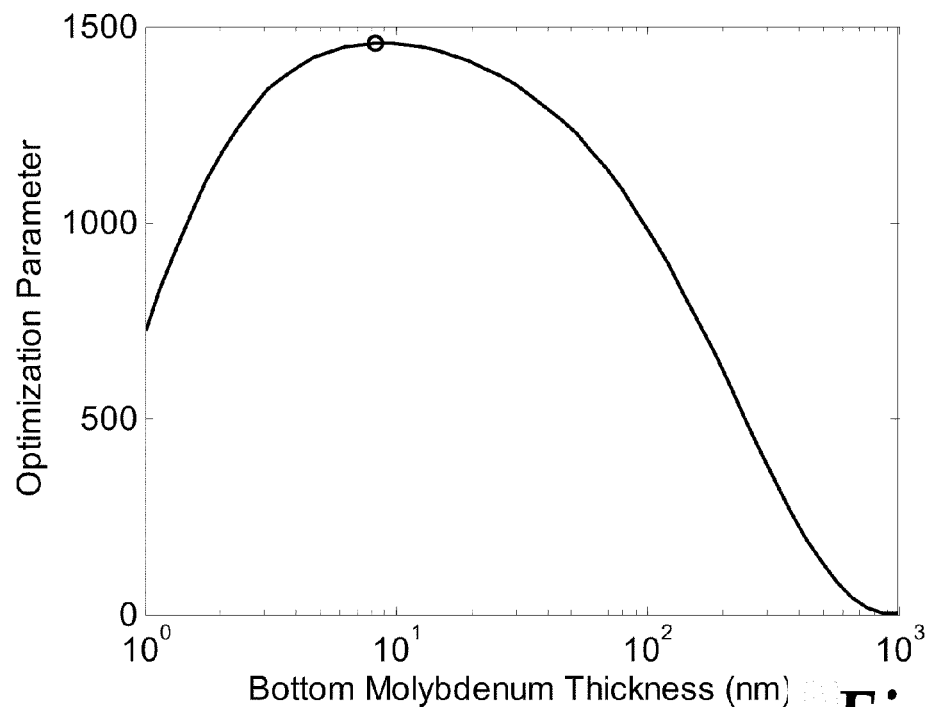
FIG. 21 depicts the calculated optimization parameter as a function of Mo bottom electrode layer thickness for a single (non-stacked) cantilever beam.
Figure 22:
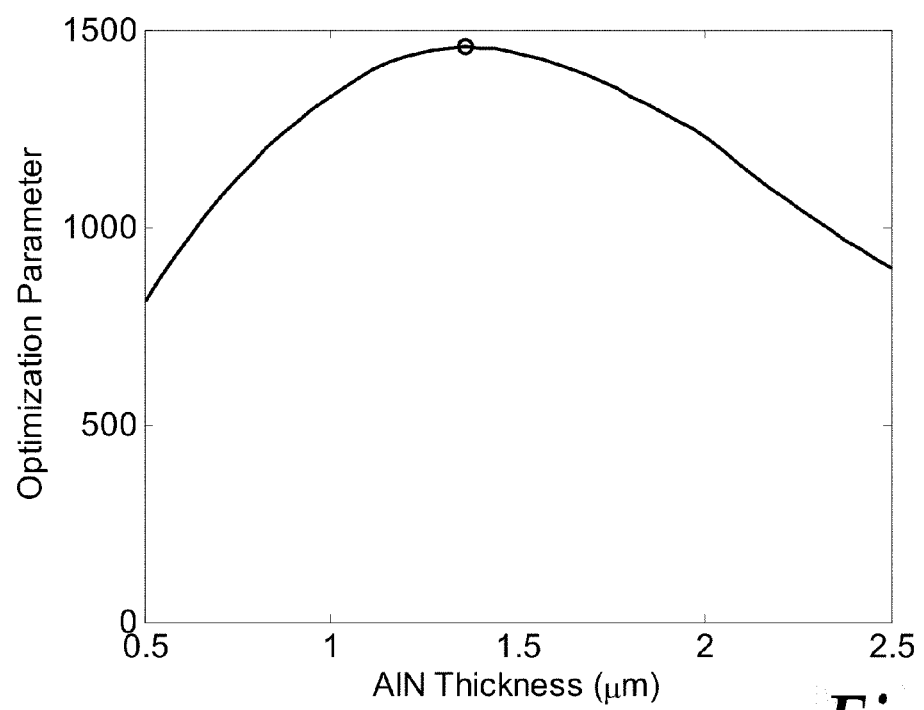
FIG. 22 depicts the calculated optimization parameter as a function of AlN intermediate layer thickness for a single (non-stacked) cantilever beam.
Figure 23:
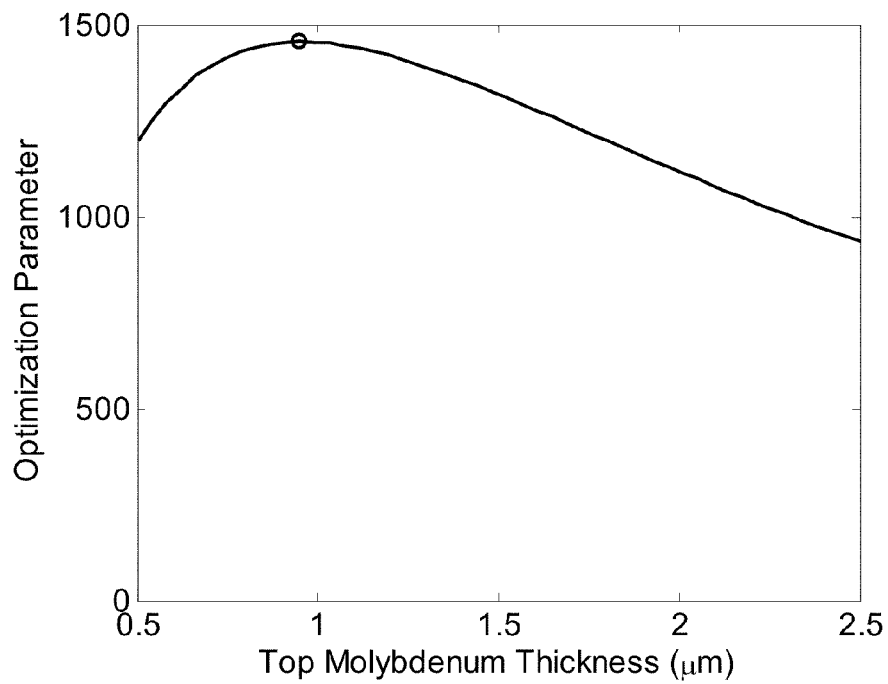
FIG. 23 depicts the calculated optimization parameter as a function of Mo upper electrode layer thickness for a single (non-stacked) cantilever beam.

For added accuracy, the fluid loading of air above and below a 1 mm×1 mm diaphragm has been added to the density summation. The natural frequency equation can then be used to calculate the length of the beam. For a natural frequency of 20 kHz, the beam will be 374 μm long. The plots of FIGS. 21-23 show the effect of changing any layer thickness on the optimization parameter. Small relative changes do not greatly affect the value of the optimization parameter except in the case of the bottom Mo thickness. For this reason, it may be wise to use a more conservative bottom Mo thickness such as 20 nm. Of course, even more conservative values that maintain the optimization parameter above 10% of its maximum obtainable value can be used; thus, electrode thicknesses of 50 nm, 100 nm or more can be used since, as shown in FIGS. 18-20 the optimization parameter, particularly of the bottom electrode, does not decrease too substantially with thicknesses in this range. If the desired sensor area is roughly 1 mm×1 mm, this beam can be made to be 1 mm wide and three of them can be placed end to end.

This same approach can be used for the stacked beam configuration shown in FIG. 3b of five alternating layers of electrodes and piezoelectric material. Calculated optimal values that maximize the optimization parameter are given below in Table 2.

TABLE 2

| Layer | Thickness |
|---|---|
| Molybdenum #1 | 10 nm |
| Aluminum Nitride #1 | 1.5 μm |
| Molybdenum #2 | 10 nm |
| Aluminum Nitride #2 | 1.5 μm |
| Molybdenum #3 | 10 nm |

Figure 24:
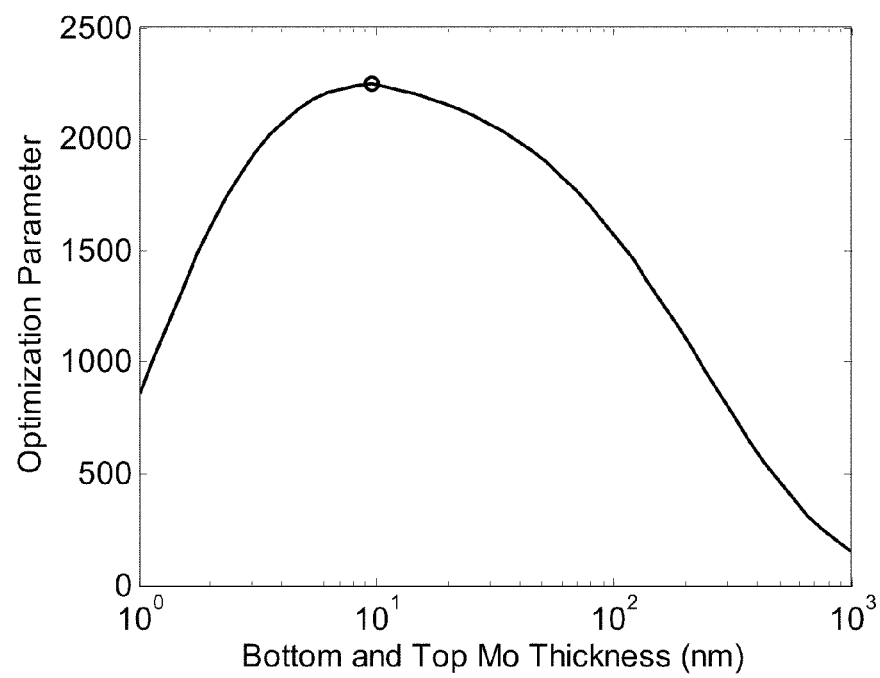
FIG. 24 depicts the calculated optimization parameter as a function of Mo bottom and top electrode layer thickness for a five layer (stacked) cantilever beam.
Figure 25:
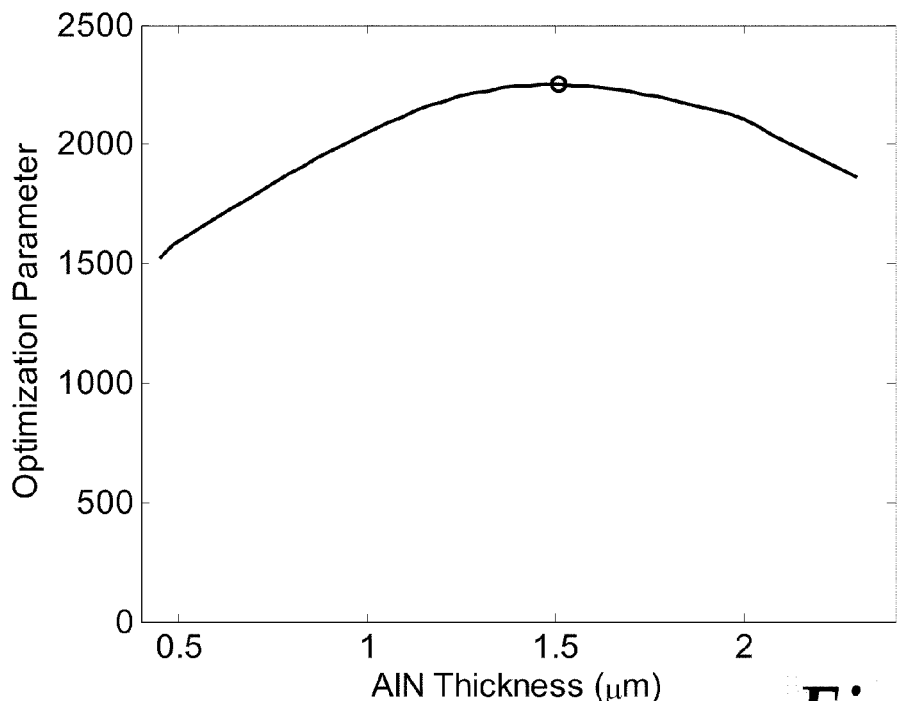
FIG. 25 depicts the calculated optimization parameter as a function of AlN intermediate layer thickness for a five layer (stacked) cantilever beam.
Figure 26:
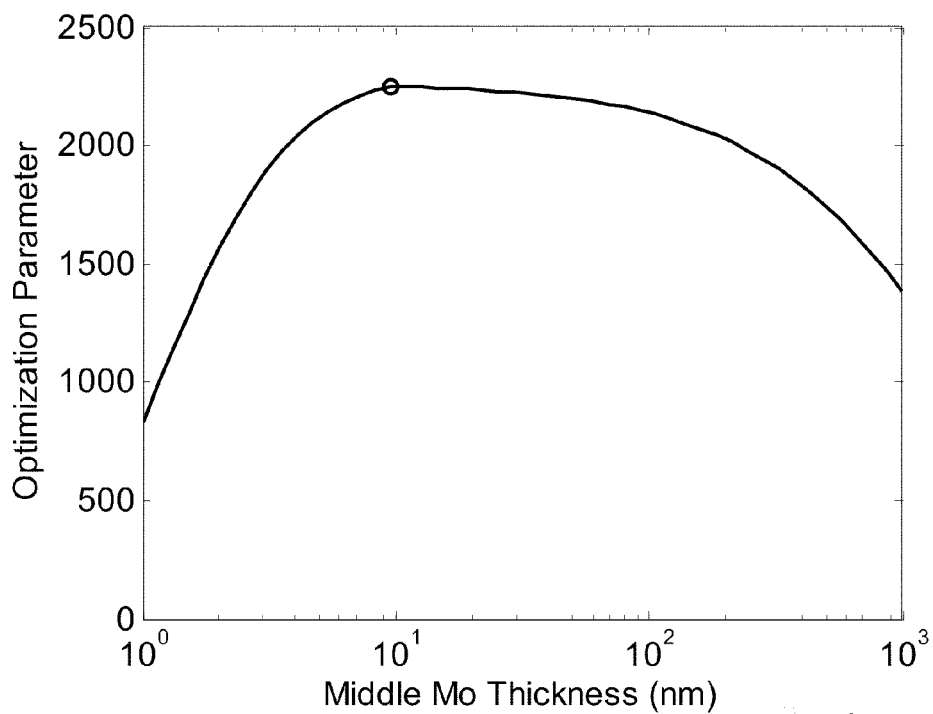
FIG. 26 depicts the calculated optimization parameter as a function of Mo middle electrode layer thickness for a five layer (stacked) cantilever beam.

The natural frequency equation can then be used to calculate the length of the beam. For a natural frequency of 20 kHz, the beam will be 461 μm. The plots of FIGS. 24-26 show the effect of changing any layer thickness on the optimization parameter. Again, these plots show that the electrode layer can be increased significantly to, e.g., 20, 50, 100 nm or more without suffering too great a reduction in the calculated output voltage to sensor area ratio, and that the middle electrode can be varied between 5 nm and 1 μm without reducing the ratio to below 10% of its maximum obtainable value.

Diaphragm Designs

Figure 27A:
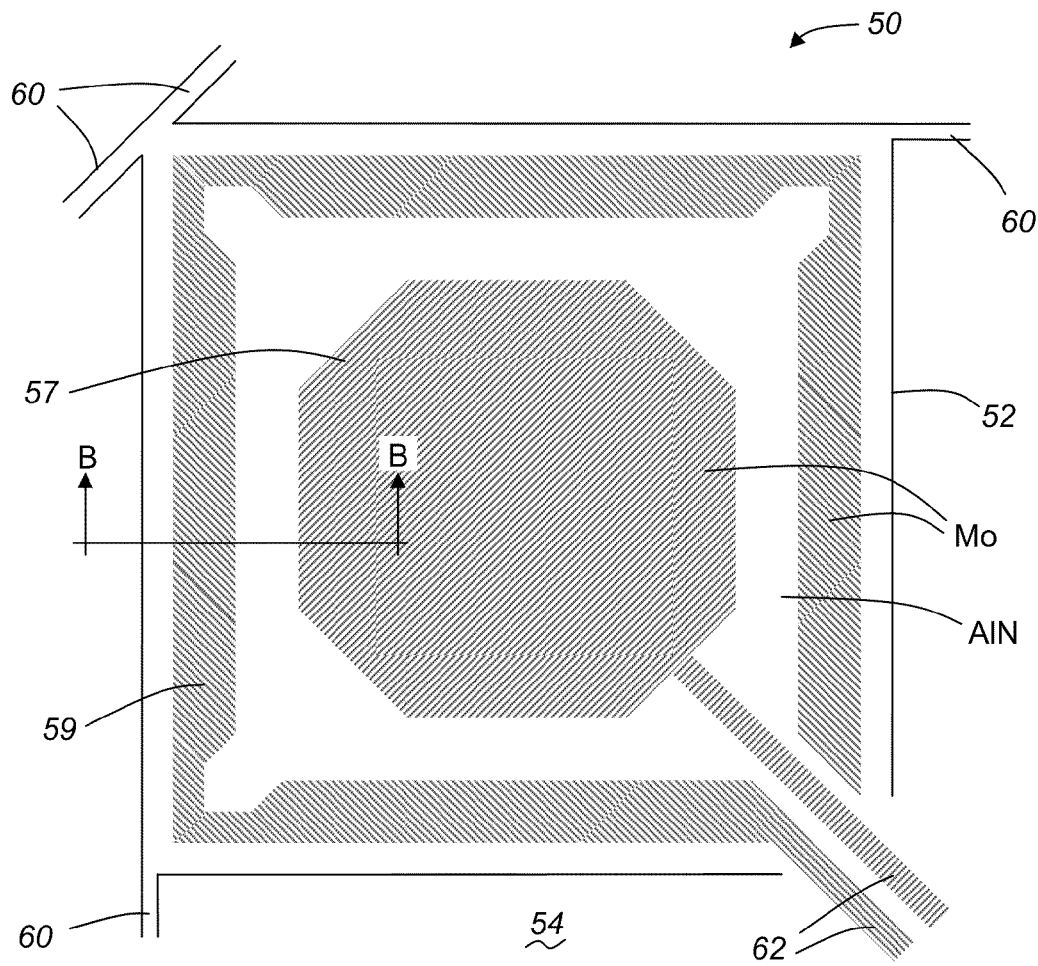
FIG. 27a is a top view of a diaphragm piezoelectric MEMS microphone sensor constructed in accordance with one aspect of the invention.
Figure 27B:
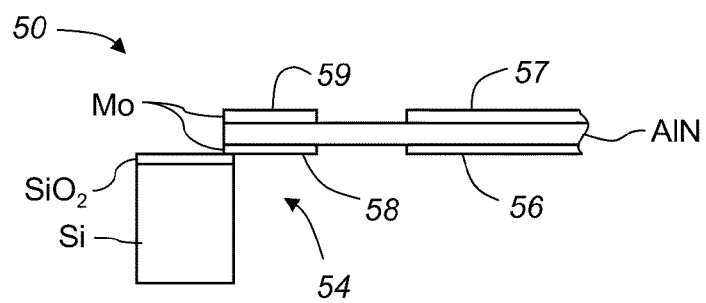

As noted above, rather than a cantilever beam structure, a stress relieved diaphragm design can also provide a good combination of sensitivity and low noise floor. Turning now to FIGS. 27a and 27b, there is shown a piezoelectric MEMS microphone 50 comprising a multi-layer acoustic sensor in the form of a stress-relieved diaphragm 52 suspended above a silicon substrate 54. In this embodiment, only three layers are used, upper and lower Mo electrode layers, and an intermediate layer of AlN piezoelectric material. However, it will be appreciated that Parylene and other material layers can also be used, and that the diaphragm can have multiple piezoelectric layers such as discussed above in connection with the stacked beam cantilever configurations. Although the illustrated embodiment includes only three layers, the upper and lower electrode layers are patterned to each define two independent electrodes. In particular, the first (lower) electrode layer includes a central electrode 56 and an outer ring shaped electrode 58 that surrounds the central electrode 56. The second (upper) electrode layer shown in FIG. 27a also includes a central electrode 57 and an outer ring shaped electrode 59 that surrounds the central electrode 57. From the perspective of the top view shown in FIG. 27a, both the central electrode 57 and outer ring electrode 59 are co-extensive with their associated lower central electrode 56 and ring electrode 58, respectively. As will be appreciated, the central electrodes 56, 57 form a first piezoelectric sensing element and the outer ring electrodes 58, 59 form a second piezoelectric sensing element. By maintaining the electrodes electrically isolated from each other, they can be wired together as desired. Since the outer ring piezoelectric sensing element is strained in the opposite direction as the central sensing element, the charge produced on these electrodes by the piezoelectric effect will be of opposite polarity, such that they can be added together by connecting central electrode 56 to outer ring electrode 59 and by connecting central electrode 57 to outer ring electrode 58. The signals from the sensor can be amplified by connection to a transistor, op-amp or other suitable circuitry in a similar manner to that discussed above in connection with the cantilever embodiments.

To obtain the stress relieved diaphragm 52, the layers can be formed by deposition onto a silicon wafer or other suitable substrate 54, with the diaphragm then being micromachined or otherwise processed to substantially detach it from the substrate so that the layers can expand or contract as necessary to relieve any residual stress. As shown in FIG. 27a, one way to accomplish this is to use springs 60 to hold the diaphragm 52 in place while it is otherwise released from the substrate 54. Once it is stress relieved, the diaphragm 52 can then be reattached to the substrate 54 about its periphery by any suitable technique, such as via electrostatic clamping. The springs 60 are created by etching through the AlN to form the border and then undercutting the springs by removing the material below them. The diaphragm 52 is connected to the substrate 54 in the bottom right corner in an area that is used for electrode leads. The springs in the remaining three corners are then fixed to the substrate 54 at one end and to the diaphragm 52 at the other. After undercutting the springs, the diaphragm 52 can be reattached to the substrate 54 by holding the bottom, outer electrode 58 at ground and applying a voltage bias to the substrate. Thus, the diaphragm 52 has a first portion of its perimeter (at the bottom right) that is attached to the substrate 54 as a direct deposition of at least one of the layers onto the substrate, and has a second portion of the perimeter attached to the substrate by separate adhesion of the second portion onto the substrate. It also is connected to the substrate 54 at the other corners by thin interconnections of one or more of the layers that act as the springs 60. Electrical connection to the central and outer ring electrodes can be by way of conductive traces 62 that extend across the piezoelectric layer at the bottom right corner where the diaphragm 52 remains connected to the substrate 54. The optimal layer thicknesses and sizes can be obtained by following the same procedure as above for the cantilever designs. A reasonable estimate of layer thicknesses can be found by using the same parameters given above; alternatively, a diaphragm model could be used for a more complete and accurate optimization.

Additional Observations

Figure 28:
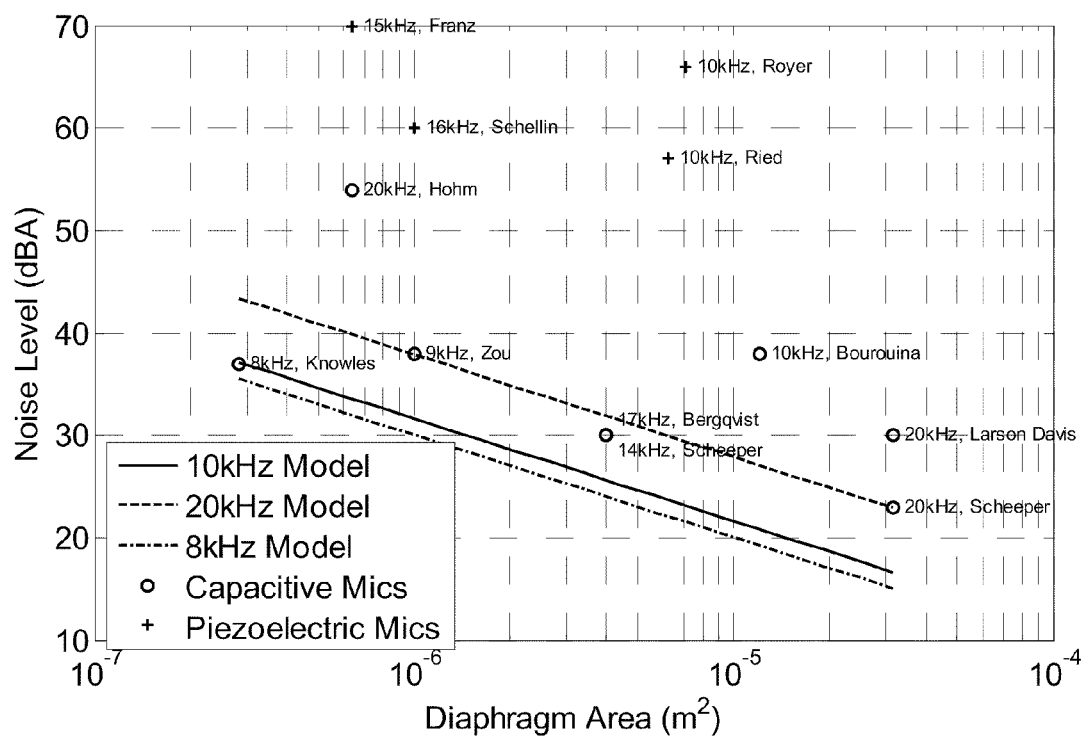
FIG. 28 is a plot of expected noise floors for piezoelectric MEMS microphones constructed in accordance with the invention, showing how they compare to known piezoelectric and capacitive MEMS microphones.

The fabricated device shows that the models are accurate and only the material and processing needs to be improved. When processing and deposition techniques allow for better material properties to be achieved, the performance will match that shown in FIG. 28. This figure indicates the performance that one could expect for the designed and fabricated devices using a JFET common source amplifier with high quality material parameters. This indicates that this design for a piezoelectric microphone can achieve a noise floor on par with well optimized capacitive microphones. Some parameters such as sensitivity and power consumption are not included in the FIG. 28 plot because these parameters are not as significantly interrelated as those given in the figure. The plus signs in the figure indicate piezoelectric microphones and the circles indicate capacitive microphones. Piezoelectric microphones typically have lower sensitivity than capacitive microphones, but this can be corrected by using an application specific integrated circuit (ASIC) to amplify the signal, as is often used in capacitive microphones. Although this figure assumes high quality piezoelectric material, it does not take into account the improvements that are possible with the use of a better electrode material, tapered beams, or a thin compliant layer in the middle of the beam. This also assumes a JFET is being used for amplification, thus limiting the noise floor. An ASIC could have a lower noise floor and improve the performance of the microphone even further. This also assumes a $\tan(\delta)$ of 0.001 but it has been shown that $\tan(\delta)$ can be reduced below this value with proper annealing.

A piezoelectric MEMS microphone constructed as described above could have commercial potential competing with electret condenser microphones (ECMs) and MEMS capacitive microphones used in consumer electronics. The design offers performance on par with ECMs and MEMS capacitive microphones but offers advantages over each. First, standard ECMs cannot be mounted to a printed circuit board using the typical lead-free solder processing used on all other microchips. This means that they must be specially attached either by hand or in a more expensive and less reliable socket. The previously described piezoelectric microphone can withstand high temperatures and therefore can be mounted using standard techniques. This piezoelectric microphone is also smaller than ECMs, allowing for a smaller overall electronic device. MEMS capacitive microphones also have these advantages and they have, therefore, been used in cell phones since 2003. MEMS capacitive microphones, however, are more expensive than ECMs due, in large part, to the application specific integrated circuit (ASIC) used to provide readout circuitry to these microphones. This is a much more expensive part than the JFET used in ECMs. The piezoelectric MEMS microphone described here can be amplified with a single JFET, therefore, creating a lower cost microphone with all the advantages of the MEMS capacitive microphone.

Apart from use as an audio microphone, the device can be used for other applications such as for ultrasonic detection, with suitable changes in the design of the microphone structure being used to optimize it for that application. Also, by covering the beams with an insulating material such as Parylene (e.g., about 1-2 µm), the microphone can be used as a hydrophone for underwater applications. Similarly, a Parylene or other suitable insulating covering could be used with the diaphragm designs described above to construct a hydrophone, in which case the device would include a pressure equalization port or other means of appropriate pressure equalization with the outside environment, as will be known by those skilled in the art.

It is to be understood that the foregoing is a description of one or more preferred exemplary embodiments of the invention. The invention is not limited to the particular embodiment(s) disclosed herein, but rather is defined solely by the claims below. Furthermore, the statements contained in the foregoing description relate to particular embodiments and are not to be construed as limitations on the scope of the invention or on the definition of terms used in the claims, except where a term or phrase is expressly defined above. Various other embodiments and various changes and modifications to the disclosed embodiment(s) will become apparent to those skilled in the art. For example, although sensor designs that provide at least 10% of the maximum ratio obtainable (or maximum obtainable optimization parameter) are suitable for many applications, more preferable designs will provide at least 25% of the maximum obtainable, and even more preferable designs will provide at least 50% of the maximum obtainable. In a highly preferred embodiment, a design using the maximum obtainable optimization parameter can be utilized. All such other embodiments, changes, and modifications are intended to come within the scope of the appended claims.

As used in this specification and claims, the terms "for example," "for instance," "such as," and "like," and the verbs "comprising," "having," "including," and their other verb forms, when used in conjunction with a listing of one or more components or other items, are each to be construed as open-ended, meaning that the listing is not to be considered as excluding other, additional components or items. Other terms are to be construed using their broadest reasonable meaning unless they are used in a context that requires a different interpretation.

REFERENCES

[1] Krommer, M., (2001). "On the correction of the Bernoulli-Euler beam theory for smart piezoelectric beams." *Smart Materials and Structures*, (10), 668-680.
[2] Irschik, H., Krommer, M., Belyaev, A. K., Schlacher, K., (1998). "Shaping of Piezoelectric Sensors/Actuators for Vibrations of Slender Beams: Coupled Theory and Inappropriate Shape Functions." *Journal of Intelligent Material Systems and Structures*, (9), 546-554.
[3] DeVoe, D. L., Pisano, A. P., (1997). "Modeling and Optimal Design of Piezoelectric Cantilever Microactuators." *Journal of Microelectromechanical Systems*, (6), 266-270.
[4] Elka, E., Elata, D., Abramovich, H., (2004). "The Electromechanical Response of Multilayered Piezoelectric Structures." *Journal of Microelectromechanical Systems*, (13), 332-341.
[5] Tiersten, H. F. (1969). "Linear Piezoelectric Plate Vibrations." (New York: Plenum).
[6] Levinzon, F. A., (2004). "Fundamental Noise Limit of Piezoelectric Accelerometer." *IEEE Sensors Journal*, (4), 108-111.
[7] Levinzon, F. A., (2000). "Noise of the JFET Amplifier." *IEEE Transactions on Circuits and Systems—I: Fundamental Theory and Applications*, (47), 981-985.
[8] Perkins, N.C. (2001), in: S. G. Braun (Ed.), Nonlinear Systems, Overview, "Encyclopedia of Vibrations." Academic Press, 944-951.
[9] Ried, R. P., Kim, E. S., Hong, D. M., Muller, R. S., (1993). "Piezoelectric Microphone with On-Chip CMOS Circuits." *Journal of Microelectromechanical Systems*, (2), 111-120.
[10] Niu, M. N., Kim, E. S., (2003). "Piezoelectric Bimorph Microphone Built on Micromachined Parylene Diaphragm." *Journal of Microelectromechanical Systems*, (12), 892-898.
[11] Trolier-McKinstry, S., Muralt, P., (2004). "Thin Film Piezoelectrics for MEMS." *Journal of Electroceramics*, (12), 7-17.
[12] Tsubouchi, K., Mikoshiba, N., (1985). "Zero-Temperature-Coefficient SAW Devices on AlN Epitaxial Thin Films." *IEEE Transactions on Sonics and Ultrasonics*, (SU-32), 634-644.
[13] Dubois, M. A., Muralt, P., (1999). "Properties of aluminum nitride thin films for piezoelectric transducers and microwave filter applications." *Applied Physics Letters*, (74), 3032-3034.
[14] Hooker, M. W., (1998). "Properties of PZT-Based Piezoelectric Ceramics Between −150 and 250° C." NASA Report: NASA/CR-1998-208708.
[15] Ledermann, N., Muralt, P., Baborowski, J., Forster, M., Pellaux, J.-P., "Piezoelectric Pb(Zrx, Ti1-x)O3 thin film cantilever and bridge acoustic sensors for miniaturized photoacoustic gas detectors." *J. Micromech. Microeng.* 14 (2004) 1650-1658.
[16] Martin, F., Muralt, P., Dubois, M. A., Pezous, A., (2004). "Thickness dependence of the properties of highly c-axis textured AlN thin films." *J. Vac. Sci. Technol. A*, Vol. 22, No. 2, 361-365.
[17] Namba, Y., (1970). *Japan J. Appl Phys*. (9), 1326-1329.

The invention claimed is:
1. A piezoelectric MEMS microphone, comprising:
a substrate; and
a multi-layer acoustic sensor comprising at least three layers including a first electrode layer, an intermediate layer of piezoelectric material deposited over said first electrode layer, and a second electrode layer deposited over said piezoelectric material;
wherein said sensor is dimensioned such that an optimization parameter calculated according to the equation

$$\text{Optimization Parameter} = \frac{V_{out}^2 C}{P^2 A \tan(\delta)} \cdot f_{res}^2$$

is at least 10% of the maximum obtainable optimization parameter for the sensor, where $V_{out}$ is output voltage of the sensor, C is the capacitance of the sensor, P is the input pressure, A is the sensor area, $\tan(\delta)$ is dielectric loss angle of the sensor at the sensor's first resonant frequency, and $f_{res}$ is the first resonant frequency;
wherein said sensor comprises a plurality of beams each supported at one end by said substrate such that each beam is cantilevered and extends between a fixed end and a free end, each beam comprising said electrode and intermediate layers; and
wherein at least two of said beams are positioned such that free ends of each beam face one another and are separated by a gap of no greater than 3 μm.

2. A piezoelectric MEMS microphone, comprising:
a substrate; and
a multi-layer acoustic sensor comprising at least three layers including a first electrode layer, an intermediate layer of piezoelectric material deposited over said first electrode layer, and a second electrode layer deposited over said piezoelectric material;
wherein said sensor is dimensioned such that an optimization parameter calculated according to the equation $$\text{Optimization Parameter} = \frac{V_{out}^2 C}{P^2 A \tan(\delta)} \cdot f_{res}^2$$

is at least 10% of the maximum obtainable optimization parameter for the sensor, where $V_{out}$ is output voltage of the sensor, C is the capacitance of the sensor, P is the input pressure, A is the sensor area, $\tan(\delta)$ is dielectric loss angle of the sensor at the sensor's first resonant frequency, and $f_{res}$ is the first resonant frequency;
wherein said sensor comprises a plurality of beams each supported at one end by said substrate such that each beam is cantilevered and extends between a fixed end and a free end, each beam comprising said electrode and intermediate layers; and
wherein adjacent beams are separated by a gap that is no greater than 10 μm.

3. A piezoelectric MEMS microphone, comprising: a substrate; and a multilayer acoustic sensor comprising a plurality of cantilevered beams, each beam comprising a first electrode layer, an intermediate layer of piezoelectric material deposited over said first electrode layer, and a second electrode layer deposited over said piezoelectric material, wherein each beam is supported at a fixed end by said substrate and extends between said fixed end and a free end, and at least two of said free ends are separated by a gap and face one another across said gap, wherein adjacent beams are separated by a gap that is no greater than 10 microns.

4. A piezoelectric MEMS microphone as defined in claim 3, wherein said sensor is dimensioned such that the ratio of output energy to sensor area for the multi-layer sensor is at least 10% of the maximum ratio obtainable for a given input pressure, bandwidth, and piezoelectric material.

5. A piezoelectric MEMS microphone as defined in claim 3, wherein said sensor is dimensioned such that an optimization parameter calculated according to the equation $$\text{Optimization Parameter} = \frac{V_{out}^2 C}{P^2 A \tan(\delta)} \cdot f_{res}^2$$

is at least 10% of the maximum obtainable optimization parameter for the sensor, where $V_{out}$ is output voltage of the sensor, C is the capacitance of the sensor, P is the input pressure, A is the sensor area, $\tan(\delta)$ is dielectric loss angle of the sensor at the sensor's first resonant frequency, and $f_{res}$ is the first resonant frequency.

6. A piezoelectric MEMS microphone as defined in claim 3, wherein said gap is no greater than 3 μm.

* * * * *